(12) United States Patent
Sawada

(10) Patent No.: US 7,888,751 B2
(45) Date of Patent: Feb. 15, 2011

(54) SEMICONDUCTOR DEVICE HAVING A FIN FIELD EFFECT TRANSISTOR

(75) Inventor: Ken Sawada, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/423,287

(22) Filed: Apr. 14, 2009

(65) Prior Publication Data
US 2009/0261423 A1 Oct. 22, 2009

(30) Foreign Application Priority Data
Apr. 16, 2008 (JP) .............................. 2008-107072

(51) Int. Cl.
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |

(52) U.S. Cl. ..................... 257/401; 257/328; 257/331
(58) Field of Classification Search ................ 257/328, 257/331, 401
See application file for complete search history.

(56) References Cited

U.S. PATENT DOCUMENTS

| 7,262,104 B1 * | 8/2007 | Wang et al. ................. 438/289 |
| 7,719,058 B2 * | 5/2010 | Seliskar ....................... 257/348 |
| 7,723,171 B2 * | 5/2010 | Yagishita et al. ............ 438/197 |
| 7,795,682 B2 * | 9/2010 | Kaneko et al. ............... 257/351 |
| 2005/0199913 A1 * | 9/2005 | Hofmann et al. ............ 257/204 |
| 2005/0263801 A1 * | 12/2005 | Park et al. .................... 257/288 |
| 2007/0075351 A1 * | 4/2007 | Schulz et al. ................ 257/314 |
| 2007/0252241 A1 * | 11/2007 | Anderson et al. ........... 257/619 |
| 2007/0292996 A1 * | 12/2007 | Abadeer et al. ............. 438/165 |
| 2008/0054361 A1 * | 3/2008 | Siprak ......................... 257/365 |
| 2008/0080248 A1 * | 4/2008 | Lue et al. ............... 365/185.18 |
| 2008/0087942 A1 * | 4/2008 | Hsu et al. .................... 257/324 |
| 2008/0203440 A1 * | 8/2008 | Tsuchiaki .................... 257/255 |
| 2008/0259687 A1 * | 10/2008 | Specht et al. .......... 365/185.17 |
| 2008/0277739 A1 * | 11/2008 | Curatola ..................... 257/393 |
| 2008/0308861 A1 * | 12/2008 | Nawaz ........................ 257/327 |
| 2008/0315309 A1 * | 12/2008 | Chang et al. ................ 257/346 |
| 2009/0148986 A1 * | 6/2009 | Cheng et al. ................ 438/157 |
| 2009/0162951 A1 * | 6/2009 | Orimoto et al. ................ 438/8 |

FOREIGN PATENT DOCUMENTS

| JP | 03-001571 | 1/1991 |
| JP | 08-181323 | 7/1996 |
| JP | 2002-118255 | 4/2002 |
| JP | 2009-158711 | 7/2009 |

OTHER PUBLICATIONS

Japanese Office Action issued on Feb. 9, 2010 in connection with counterpart Japanese Patent Application No. 2008-107072.

* cited by examiner

Primary Examiner—Ida M Soward
(74) Attorney, Agent, or Firm—SNR Denton US LLP

(57) ABSTRACT

A semiconductor device includes a fin field effect transistor configured to include at least a first fin and a second fin. Threshold voltage of the first fin and threshold voltage of the second fin are different from each other in the fin field effect transistor.

19 Claims, 29 Drawing Sheets

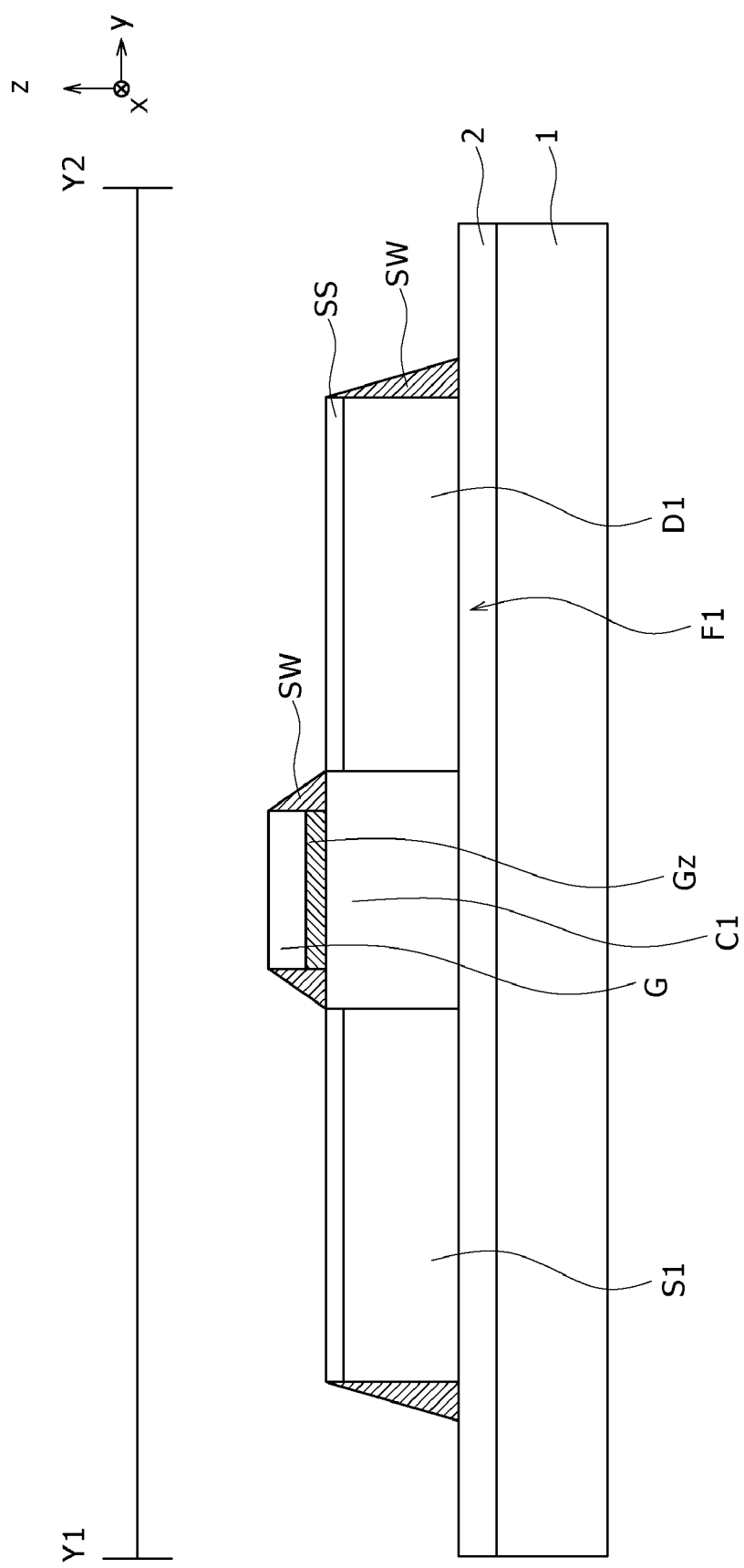

SEMICONDUCTOR DEVICE HAVING A FIN FIELD EFFECT TRANSISTOR

BACKGROUND OF THE INVENTION

1. Field of the Invention

The present invention relates to a semiconductor device and a method for manufacturing the same. In particular, the present invention relates to a semiconductor device having a fin field effect transistor including at least a first fin and a second fin.

2. Description of the Related Art

In a semiconductor device, e.g. a field effect transistor (FET) is provided as a semiconductor element used as a high-frequency amplifying element, switch element, or the like. An FET fabricated by using a compound semiconductor such as GaAs or InP is frequently employed because it can achieve high gain in the high-frequency region and is excellent in the linearity.

For the semiconductor device, miniaturization of the semiconductor element is required in order to enhance the integration degree. In the above-described FET, the gate length is becoming smaller for the miniaturization. However, this gate length decrease often causes characteristic deterioration such as the deterioration of the cut-off characteristic of the drain current attributed to the occurrence of the punch-through phenomenon due to the short-channel effect.

To suppress the occurrence of this problem, a fin field effect transistor (finFET) has been proposed (refer to e.g. Japanese Patent Laid-open No. 2002-118255).

In the finFET, a plate-shape fin including a channel forming region is so formed as to protrude from a substrate surface, and a gate electrode is so formed as to sandwich and cover both the side surfaces of the channel forming region in the fin. Therefore, the finFET can suppress the occurrence of the punch-through phenomenon due to the short-channel effect and enhance the cut-off characteristic of the drain current.

Furthermore, for the finFET, it is easy to form the desired number of fins per one gate electrode, and thus the drain current can be increased to the desired value. Therefore, if the finFET is formed as a multi-fin FET, it can be used as a high-frequency power element excellent in the maximum oscillation frequency fmax and the cut-off frequency fT.

SUMMARY OF THE INVENTION

However, it is not easy for the finFET of the related art to meet requirements for high gain in a wide band and a low distortion characteristic.

There is a need for the present invention to provide a semiconductor device that can easily achieve high gain in a wide band and a low distortion characteristic, and a method for manufacturing the same.

According to an embodiment of the present invention, there is provided a semiconductor device including a fin field effect transistor configured to include at least a first fin and a second fin. In the fin field effect transistor, the threshold voltage of the first fin and the threshold voltage of the second fin are different from each other.

According to another embodiment of the present invention, there is provided a method for manufacturing a semiconductor device. The method includes the step of forming a fin field effect transistor that includes at least a first fin and a second fin. In the forming the fin field effect transistor, the first fin and the second fin are so provided that the threshold voltage of the first fin and the threshold voltage of the second fin are different from each other.

In the embodiments of the present invention, the fin field effect transistor including the first fin and the second fin is so formed that the threshold voltage of the first fin and the threshold voltage of the second fin are different from each other.

The embodiments of the present invention can provide a semiconductor device that can easily achieve high gain in a wide band and a low distortion characteristic, and a method for manufacturing the same.

BRIEF DESCRIPTION OF THE DRAWINGS

FIG. 18 is a sectional view schematically showing major part of the semiconductor device according to the second embodiment of the present invention;

DETAILED DESCRIPTION OF THE PREFERRED EMBODIMENTS

Embodiments of the present invention will be described below.

First Embodiment (Structure)

Figure 1:
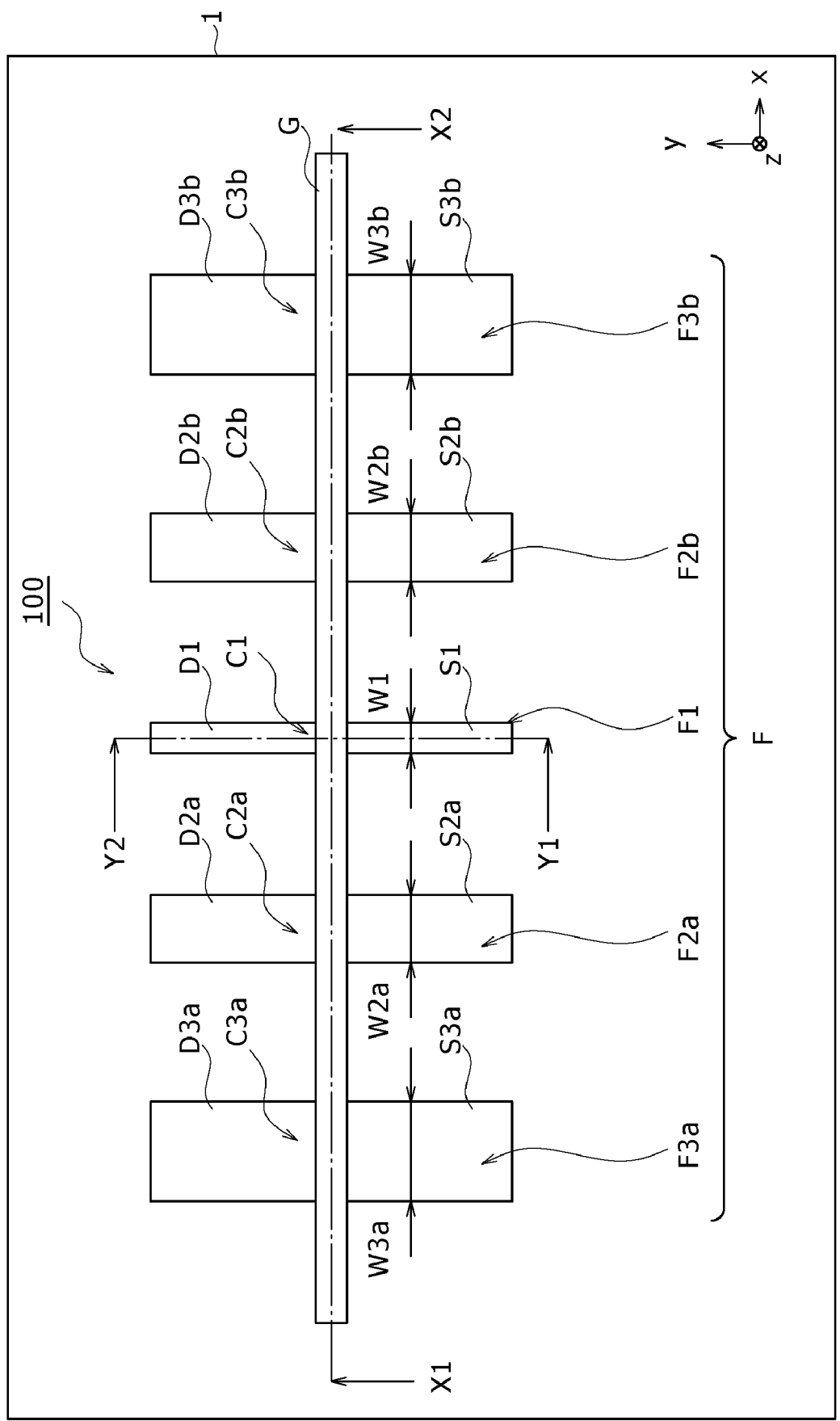
FIG. 1 is a plan view schematically showing major part of a semiconductor device according to a first embodiment of the present invention.

FIG. 1 is a plan view schematically showing major part of a semiconductor device according to a first embodiment of the present invention.

Figure 2:
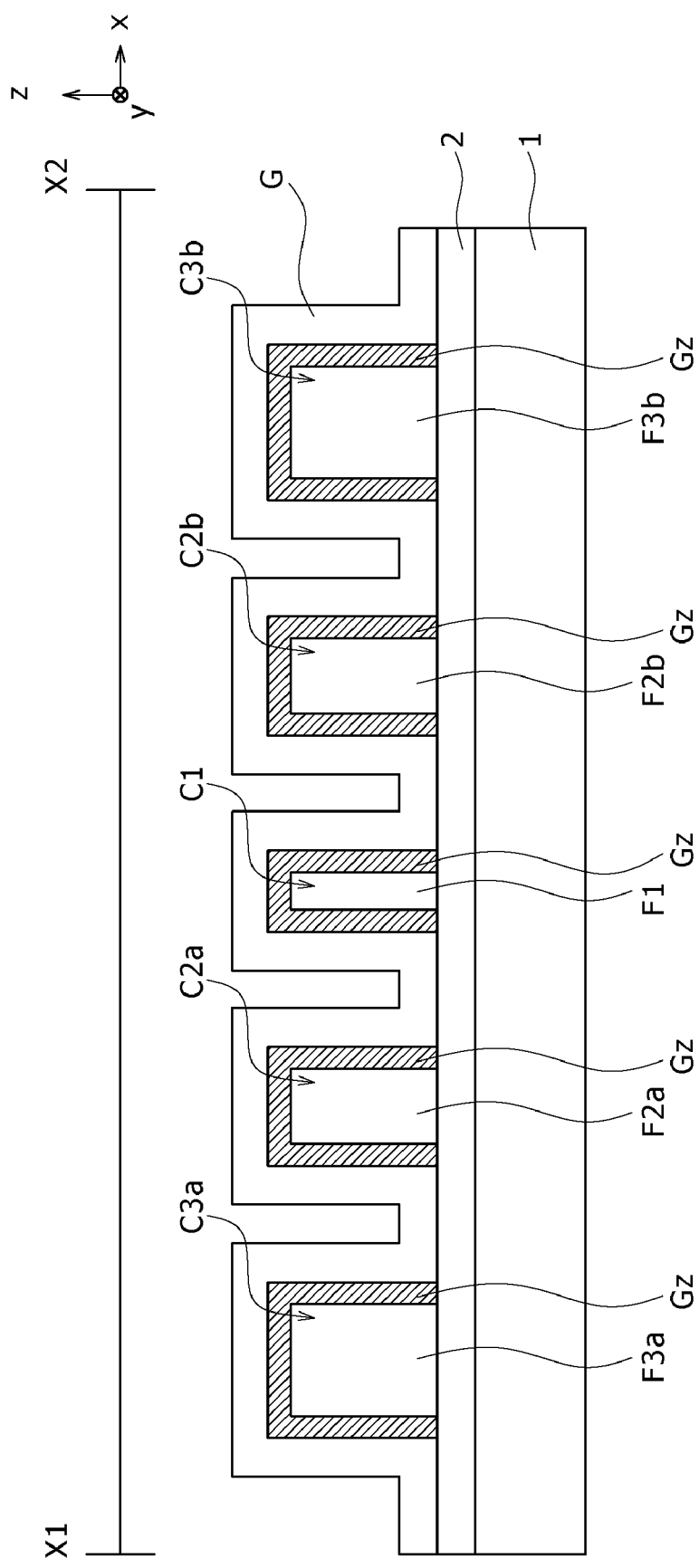
FIG. 2 is a sectional view schematically showing major part of the semiconductor device according to the first embodiment of the present invention.
Figure 3:
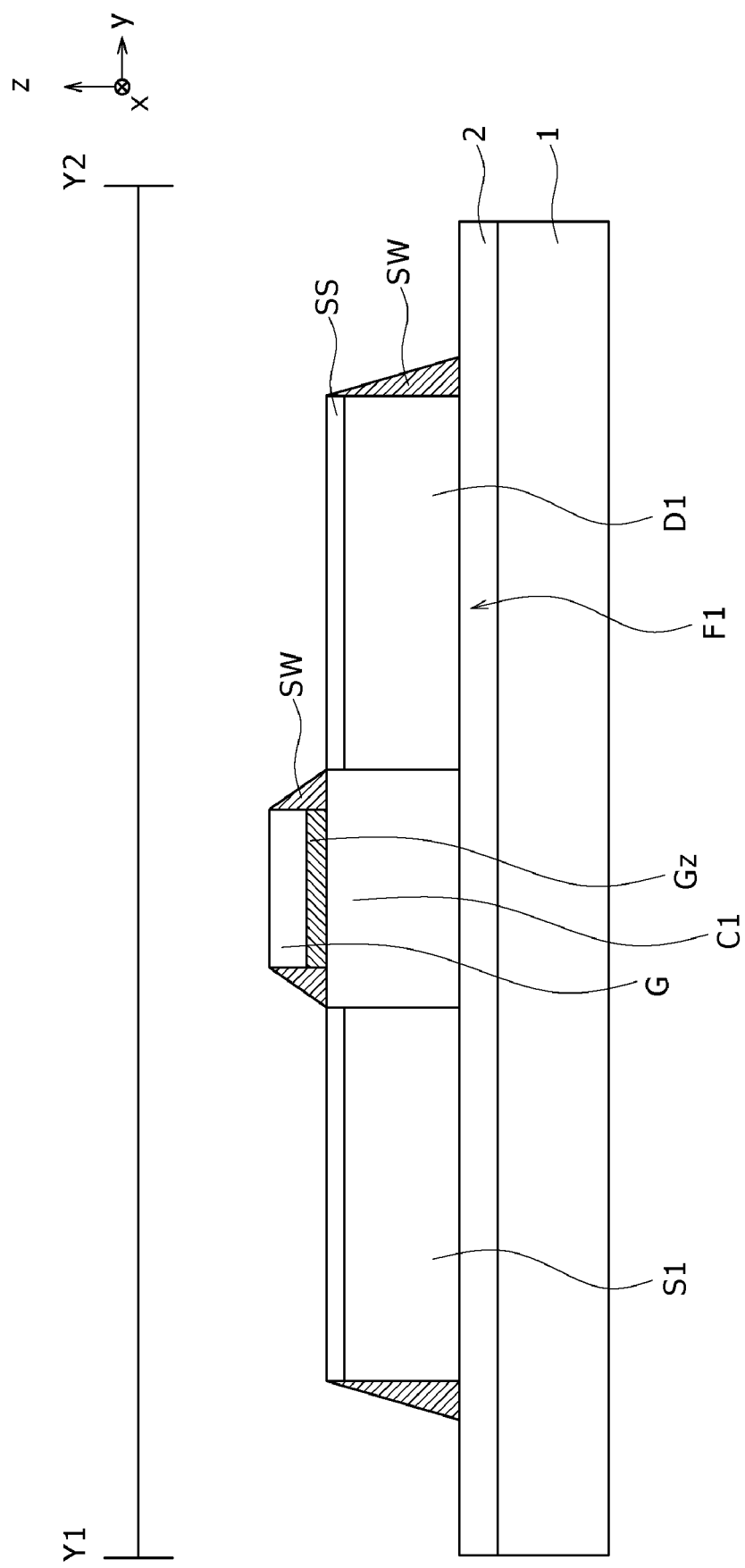
FIG. 3 is a sectional view schematically showing major part of the semiconductor device according to the first embodiment of the present invention.

FIGS. 2 and 3 are sectional views schematically showing major part of the semiconductor device according to the first embodiment of the present invention.

Specifically, FIG. 2 is a sectional view corresponding to the plane that is along line X1-X2 in FIG. 1 and perpendicular to the paper plane of FIG. 1. FIG. 3 is a sectional view corresponding to the plane that is along line Y1-Y2 in FIG. 1 and perpendicular to the paper plane of FIG. 1.

As shown in FIG. 1, the semiconductor device of the present embodiment has a finFET 100. The finFET 100 includes fins F and a gate electrode G.

In this finFET 100, the fins F include five fins F1, F2$a$, F2$b$, F3$a$, and F3$b$ as shown in FIG. 1. These five fins F1, F2$a$, F2$b$, F3$a$, and F3$b$ are formed of e.g. a silicon semiconductor.

Each of five fins F1, F2$a$, F2$b$, F3$a$, and F3$b$ of the fins F extends in a line manner along the y direction of the xy plane of a substrate 1 as shown in FIG. 1. These five fins F1, F2$a$, F2$b$, F3$a$, and F3$b$ are juxtaposed to each other at intervals along the x direction.

As shown in FIG. 2, in this finFET 100, a buried oxide film (BOX) 2 is formed on the xy plane of the substrate 1 and each of five fins F1, F2$a$, F2$b$, F3$a$, and F3$b$ protrudes from the surface of the buried oxide film 2. Specifically, the buried oxide film 2 formed of e.g. a silicon oxide film is formed on the xy plane of the substrate 1 composed of e.g. a silicon semiconductor. Five fins F1, F2$a$, F2$b$, F3$a$, and F3$b$ protrude in a convex manner in the z direction perpendicular to the surface of the buried oxide film 2. These five fins F1, F2$a$, F2$b$, F3$a$, and F3$b$ are identical to each other in the height of this protrusion in the z direction.

Of five fins F1, F2$a$, F2$b$, F3$a$, and F3$b$ included in the fins F, the first fin F1 located at the center in the x direction has a pair of source/drain regions S1 and D1 formed therein as shown in FIGS. 1 and 3. Furthermore, in this first fin F1, the pair of source/drain regions S1 and D1 sandwich a channel forming region C1 along the y direction. In addition, in this first fin F1, as shown in FIG. 3, a silicide layer SS is so formed as to cover the top surfaces of the pair of source/drain regions S1 and D1 in the first fin F1.

Similarly, two second fins F2$a$ and F2$b$ adjacent to the first fin F1 along the x direction have pairs of source/drain regions S2$a$, D2$a$, S2$b$, and D2$b$ formed therein as shown in FIG. 1. Furthermore, in each of two second fins F2$a$ and F2$b$, the pairs of source/drain regions S2$a$, D2$a$, S2$b$, and D2$b$ sandwich channel forming regions C2$a$ and C2$b$ along the y direction. In addition, a silicide layer (not shown) is formed for these second fins F2$a$ and F2$b$ similarly to the first fin F1 shown in FIG. 3.

Two third fins F3$a$ and F3$b$, which are located at both the ends in the x direction and adjacent to the second fins F2$a$ and F2$b$, have pairs of source/drain regions S3$a$, D3$a$, S3$b$, and D3$b$ formed therein as shown in FIG. 1. Furthermore, in each of two third fins F3$a$ and F3$b$, the pairs of source/drain regions S3$a$, D3$a$, S3$b$, and D3$b$ sandwich channel forming regions C3$a$ and C3$b$ along the y direction. In addition, a silicide layer (not shown) is formed for these third fins F3$a$ and F3$b$ similarly to the first fin F1 shown in FIG. 3.

In the present embodiment, of these five fins F1, F2$a$, F2$b$, F3$a$, and F3$b$, the first fin F1 at the center in the x direction is so formed as to have threshold voltage Vth different from that of two second fins F2$a$ and F2$b$ adjacent to the first fin F1. Furthermore, the first fin F1 at the center in the x direction is so formed as to have the threshold voltage Vth different from that of two third fins F3$a$ and F3$b$ at both the ends in the x direction. In addition, the threshold voltage Vth is made different also between two second fins F2$a$ and F2$b$ adjacent to the first fin F1 at the center and two third fins F3$a$ and F3$b$ at both the ends in the x direction.

Specifically, as shown in FIGS. 1 and 2, the widths of the respective fins extending along the y direction of the xy plane are so adjusted as to be different from each other among the first fin F1, the second fins F2$a$ and F2$b$, and the third fins F3$a$ and F3$b$, to thereby make the threshold voltages Vth of the fins different from each other.

For example, of five fins F1, F2a, F2b, F3a, and F3b, the first fin F1 at the center in the x direction is so formed that its width W1 extending along the y direction of the xy plane as shown in FIG. 1 is e.g. 100 nm.

Furthermore, two second fins F2a and F2b adjacent to the first fin F1 along the x direction are so formed that their width W2 extending along the y direction of the xy plane is larger than the width W1 of the first fin F1 as shown in FIG. 1. In this finFET 100, the width W2 of the second fins F2a and F2b is set larger by e.g. 70 nm than the width W1 of the first fin F1.

Moreover, two third fins F3a and F3b at both the ends in the x direction are so formed that their width W3 extending along the y direction of the xy plane is larger than the width W1 of the first fin F1 and the width W2 of the second fins F2a and F2b as shown in FIG. 1. In this finFET 100, the width W3 of the third fins F3a and F3b is set larger by e.g. 70 nm than the width W2 of the second fins F2a and F2b.

For these five fins F1, F2a, F2b, F3a, and F3b, a gate insulating film Gz is provided as shown in FIGS. 2 and 3.

The gate insulating film Gz is formed by using e.g. a silicon oxide film. In this finFET 100, the gate insulating film Gz is provided on the surfaces of the regions corresponding to the channel forming regions C1, C2a, C2b, C3a, and C3b of the respective fins F1, F2a, F2b, F3a, and F3b as shown in FIGS. 2 and 3.

In the present embodiment, as shown in FIG. 2, the gate insulating film Gz is so formed as to cover both the side surfaces of the respective fins F1, F2a, F2b, F3a, and F3b, perpendicular to the xy plane of the substrate 1, and the top surfaces thereof, parallel to the xy plane of the substrate 1, which are surfaces extending along the y direction.

In the finFET 100, the gate electrode G is so provided as to intersect with five fins F1, F2a, F2b, F3a, and F3b as shown in FIG. 1. Specifically, the gate electrode G extends along the x direction of the xy plane of the substrate 1 and is at right angles to each of five fins F1, F2a, F2b, F3a, and F3b.

This gate electrode G corresponds to the respective channel forming regions C1, C2a, C2b, C3a, and C3b of five fins F1, F2a, F2b, F3a, and F3b as shown in FIG. 1.

In addition, the gate electrode G protrudes in a convex manner over the xy plane of the substrate 1 as shown in FIG. 2. Furthermore, the gate electrode G covers, through the gate insulating film Gz, both the side surfaces of five fins F1, F2a, F2b, F3a, and F3b, perpendicular to the xy plane of the substrate 1, and the top surfaces thereof, parallel to the xy plane of the substrate 1, which are surfaces extending along the y direction.

In addition, sidewalls SW are formed on the side surfaces of this gate electrode G as shown in FIG. 3.

(Manufacturing Method)

Major part of a method for manufacturing the above-described semiconductor device in the present embodiment will be described below.

FIGS. 4A to 14E are diagrams showing device major part manufactured in the respective steps in the method for manufacturing the semiconductor device according to the first embodiment of the present invention. In FIGS. 4A to 14E, device major part manufactured in the respective steps is sequentially shown in the order of the diagram number.

Each of FIGS. 4A to 4H and 14A to 14E includes sectional views corresponding to the plane that is along line X1-X2 in FIG. 1 and perpendicular to the paper plane of FIG. 1, similarly to FIG. 2. FIG. 5 is a perspective view. In FIGS. 6A to 13B, the upper diagram is a sectional view corresponding to the plane that is along line X1-X2 in FIG. 1 and perpendicular to the paper plane of FIG. 1, whereas the lower diagram is a sectional view corresponding to the plane that is along line Y1-Y2 in FIG. 1 and perpendicular to the paper plane of FIG. 1.

Figure 4A:
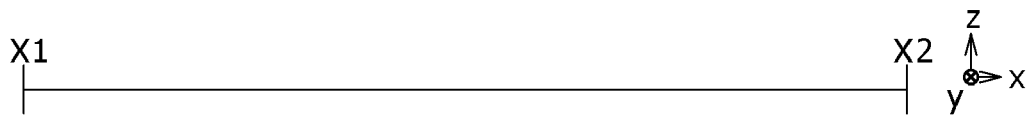
FIGS. 4A to 4H are diagrams showing device major part manufactured in the respective steps in a method for manufacturing the semiconductor device according to the first embodiment of the present embodiment.
Figure 5:
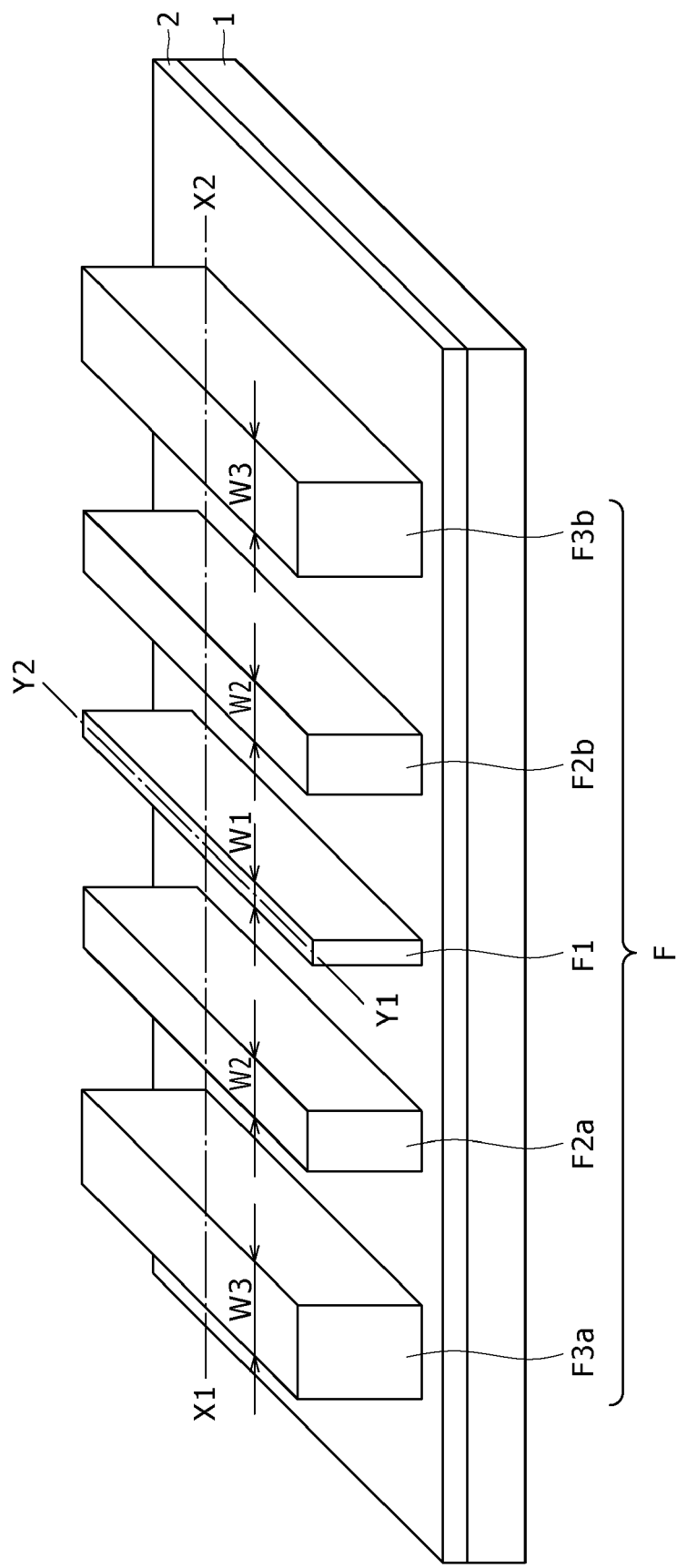
FIG. 5 is a diagram showing device major part manufactured in the respective steps in the method for manufacturing the semiconductor device according to the first embodiment of the present embodiment.

First, as shown in FIG. 4A, the buried oxide film 2 and a semiconductor layer 3 are provided over the surface of the substrate 1.

In this step, oxygen ions are implanted into a position deep from the surface of the substrate 1 composed of a silicon semiconductor and heat treatment is performed to thereby form the buried oxide film 2 formed of a silicon oxide film on the substrate 1. In addition, the semiconductor layer 3 composed of a silicon semiconductor is provided on the surface of the buried oxide film 2. In this manner, an SOI substrate based on a SIMOX (separation by implantation of oxygen) structure is prepared in the present embodiment.

Figure 4B:
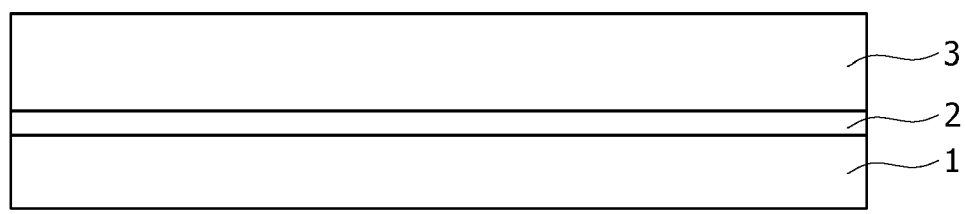

Subsequently, ion implantation into the semiconductor layer 3 is performed as shown in FIG. 4B.

In this step, a resist mask R1 is provided that has an aperture corresponding to the region in which the respective channel forming regions C1, C2a, C2b, C3a, and C3b of five fins F1, F2a, F2b, F3a, and F3b are to be provided in the semiconductor layer 3 as shown in FIG. 2. Specifically, a photoresist film (not shown) composed of a photosensitive material is deposited on the entire surface of the semiconductor layer 3, and then this photoresist film is pattern-processed by photolithography, to thereby provide this resist mask R1.

Thereafter, with use of this resist mask R1, the ion implantation is performed for the region in which the channel forming regions C1, C2a, C2b, C3a, and C3b of five fins F1, F2a, F2b, F3a, and F3b are to be provided. For example, boron (B) is ion-implanted with a dose of $2 \times 10^{12}/\text{cm}^2$.

Figure 4C:
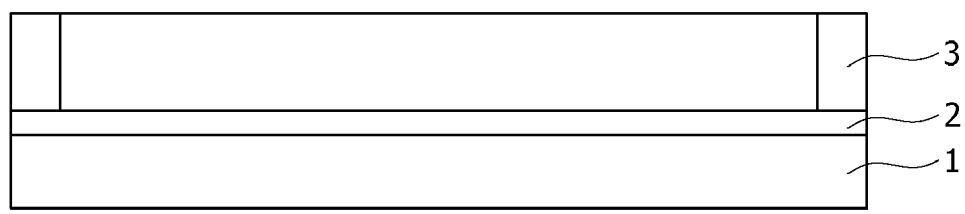

Subsequently, the resist mask R1 is removed as shown in FIG. 4C.

For example, ashing treatment is performed for the removal of the resist mask R1.

Figure 4D:
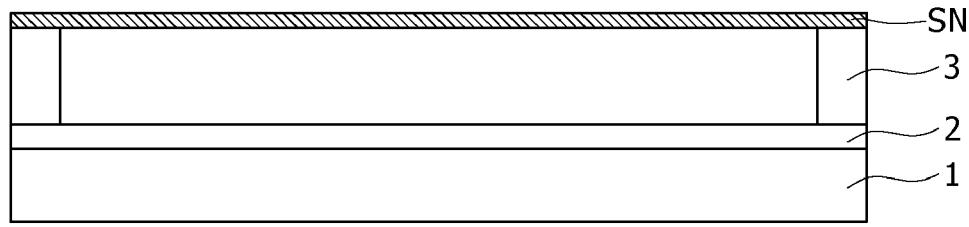

Subsequently, a silicon nitride film SN is provided as shown in FIG. 4D.

In this step, the silicon nitride film SN is deposited on the surface of the semiconductor layer 3 by plasma chemical vapor deposition (CVD).

Figure 4E:
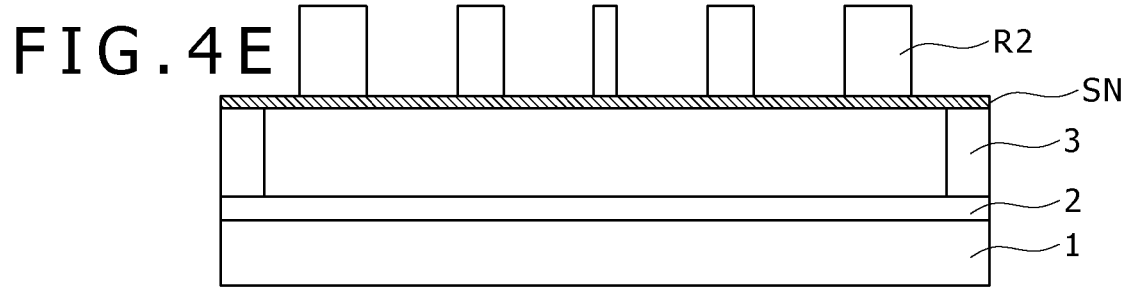

Subsequently, a resist mask R2 is provided as shown in FIG. 4E.

In this step, a photoresist film (not shown) composed of a photosensitive material is deposited by spin coating on the surface of the silicon nitride film SN as the pattern-processing target surface. Subsequently, a photomask (not shown) having the mask pattern corresponding to the design pattern is irradiated with light, and a mask pattern image arising due to this light irradiation is transferred to this photoresist film through exposure thereof. Thereafter, the photoresist film to which this mask pattern image has been transferred is developed to form the resist mask R2.

In the present embodiment, the photoresist film is so pattern-processed that the silicon nitride film SN will cover the surface corresponding to the part in which five fins F1, F2a, F2b, F3a, and F3b are to be provided as shown in FIG. 2 and the surface of the other part will be exposed. This forms the resist mask R2 shown in FIG. 4E.

Figure 4F:
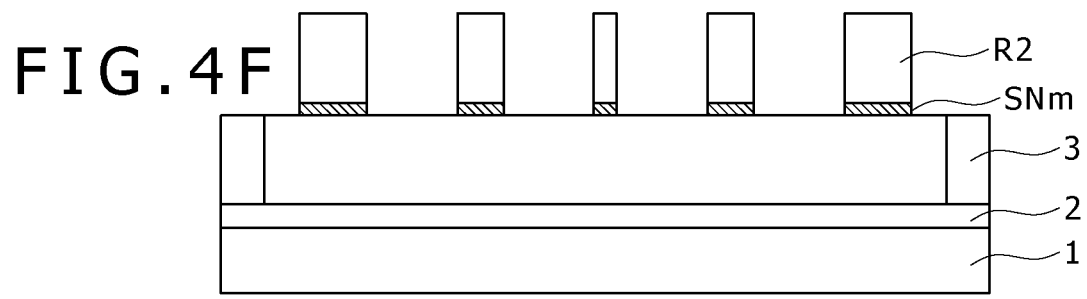

Subsequently, a hard mask SNm is formed as shown in FIG. 4F.

In this step, the hard mask SNm is formed by pattern-processing of the silicon nitride film SN with use of the resist mask R2. For example, etching treatment is performed for the silicon nitride film SN by reactive ion etching (RIE) until the surface of the semiconductor layer 3 is exposed. For example, $CF_4$-based RIE is performed.

In the present embodiment, the etching treatment of the silicon nitride film SN is so performed that the surface of the part in which five fins F1, F2a, F2b, F3a, and F3b are to be provided in the semiconductor layer 3 as shown in FIG. 2 is covered and the surface of the other part is exposed. This forms the hard mask SNm shown in FIG. 4F.

Figure 4G:
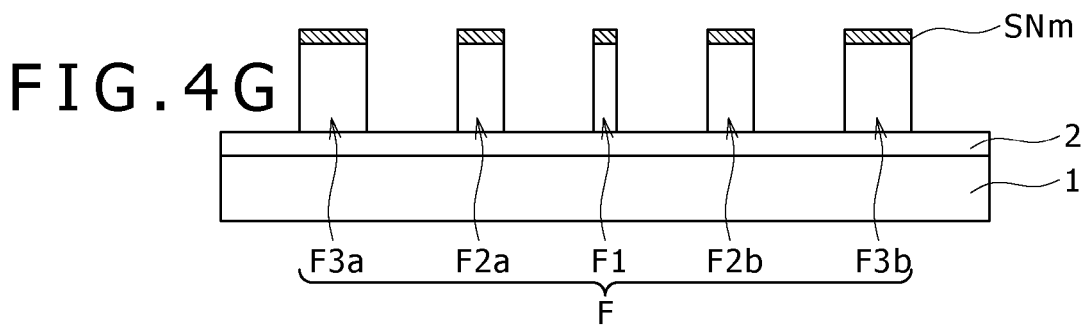

Subsequently, the fins F are formed as shown in FIG. 4G.

In this step, after the resist mask R2 is removed by e.g. ashing treatment, the semiconductor layer 3 is pattern-processed by using the hard mask SNm, to thereby form the fins F. For example, etching treatment is performed for the semiconductor layer 3 by RIE until the surface of the buried oxide film 2 is exposed. For example, HBr-based RIE is performed. This forms five fins F1, F2a, F2b, F3a, and F3b from the semiconductor layer 3 as shown in FIG. 4G.

Figure 4H:
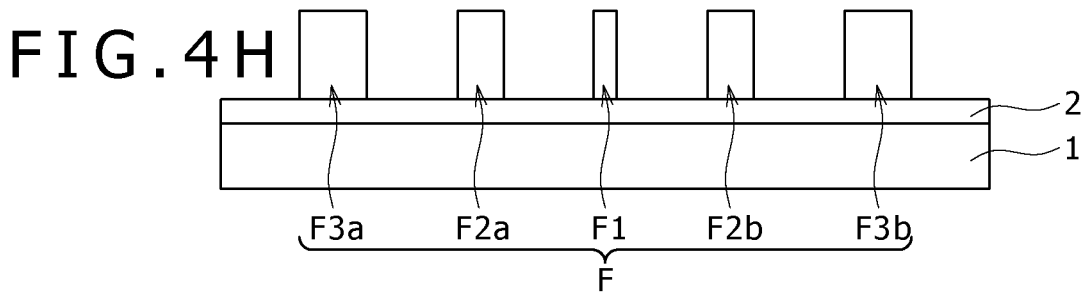

Subsequently, the hard mask SNm is removed as shown in FIG. 4H.

In this step, this hard mask SNm is removed by e.g. wet etching treatment.

By this step, five fins F1, F2a, F2b, F3a, and F3b are formed as shown in FIG. 5.

Specifically, two second fins F2a and F2b adjacent to the first fin F1 along the x direction are so formed that their width W2 extending along the y direction of the xy plane is larger than the width W1 of the first fin F1 as shown in FIG. 5. Furthermore, two third fins F3a and F3b at both the ends in the x direction are so formed that their width W3 extending along the y direction of the xy plane is larger than the width W1 of the first fin F1 and the width W2 of the second fins F2a and F2b as shown in FIG. 5.

Figure 6A:
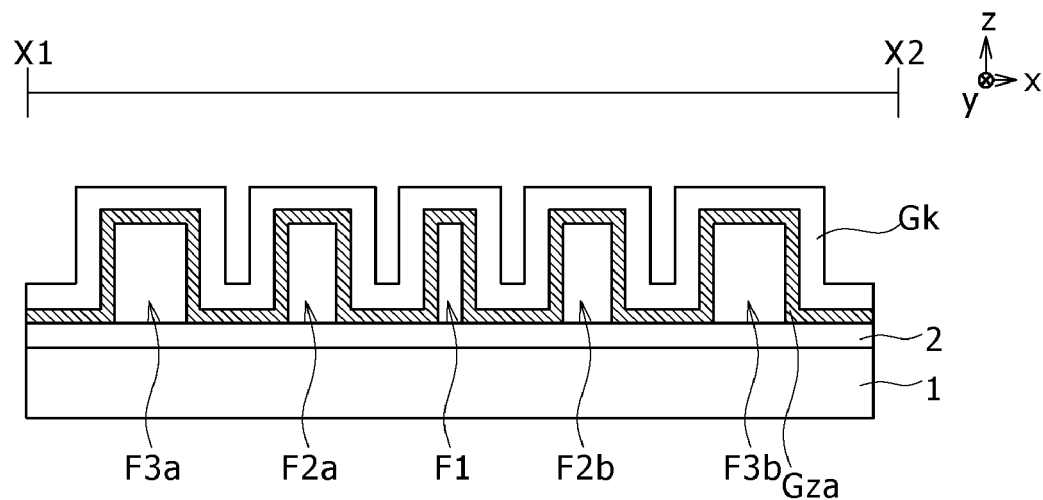
FIGS. 6A and 6B are diagrams showing device major part manufactured in the respective steps in the method for manufacturing the semiconductor device according to the first embodiment of the present embodiment.
Figure 6B:
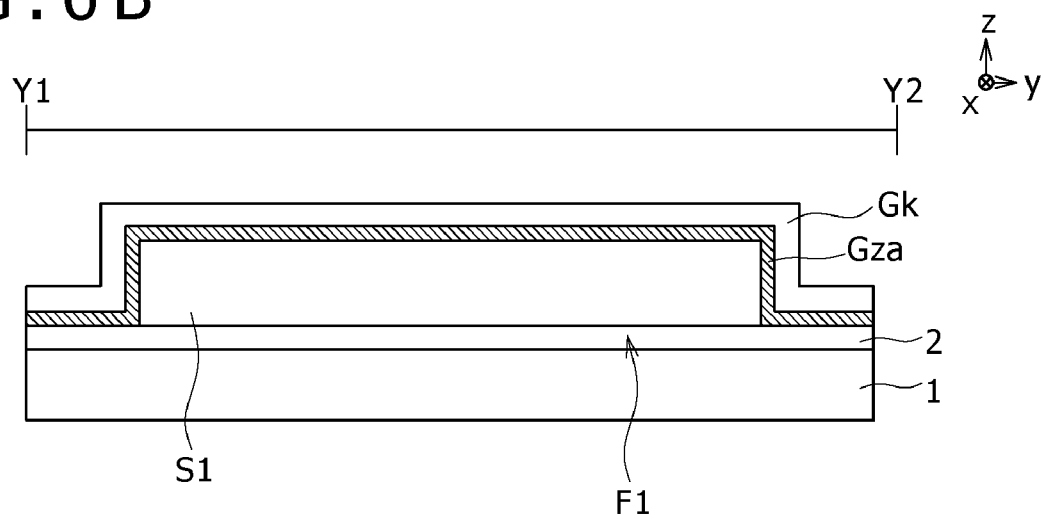

Subsequently, an insulating film Gza and a metal layer Gk are formed as shown in FIGS. 6A and 6B.

Specifically, the insulating film Gza is formed on the surfaces of five fins F1, F2a, F2b, F3a, and F3b as shown in FIGS. 6A and 6B. For example, this insulating film Gza is formed by performing thermal oxidation treatment for the fins F1, F2a, F2b, F3a, and F3b to thereby provide a silicon oxide film ($SiO_2$) having a thickness of e.g. about 2 nm. Alternatively, a high dielectric constant insulating film composed of SiON, $HfO_2$, or the like may be formed as the insulating film Gza on the surfaces of five fins F1, F2a, F2b, F3a, and F3b.

Thereafter, the metal layer Gk is so formed as to cover the insulating film Gza as shown in FIGS. 6A and 6A.

In this method, a WSi film is formed as the metal layer Gk by sputtering for example. Alternatively, a refractory metal layer composed of MoSi, TiN, or the like or a multilayer body of these substances may be formed as the metal layer Gk.

Figure 7A:
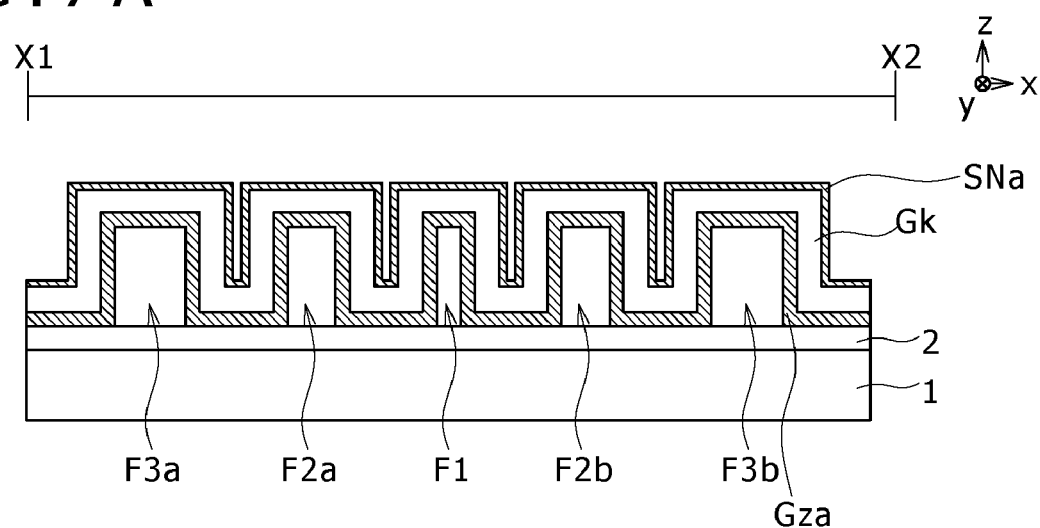
FIGS. 7A and 7B are diagrams showing device major part manufactured in the respective steps in the method for manufacturing the semiconductor device according to the first embodiment of the present embodiment.
Figure 7B:
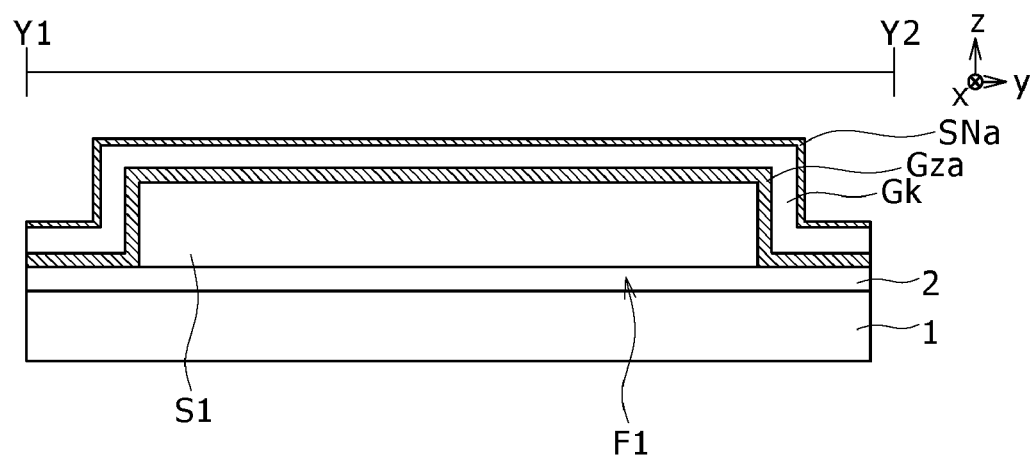

Subsequently, a silicon nitride film SNa is provided as shown in FIGS. 7A and 7B.

In this step, the silicon nitride film SNa is deposited on the surface of the metal layer Gk by plasma CVD as shown in FIGS. 7A and 7B.

Figure 8A:
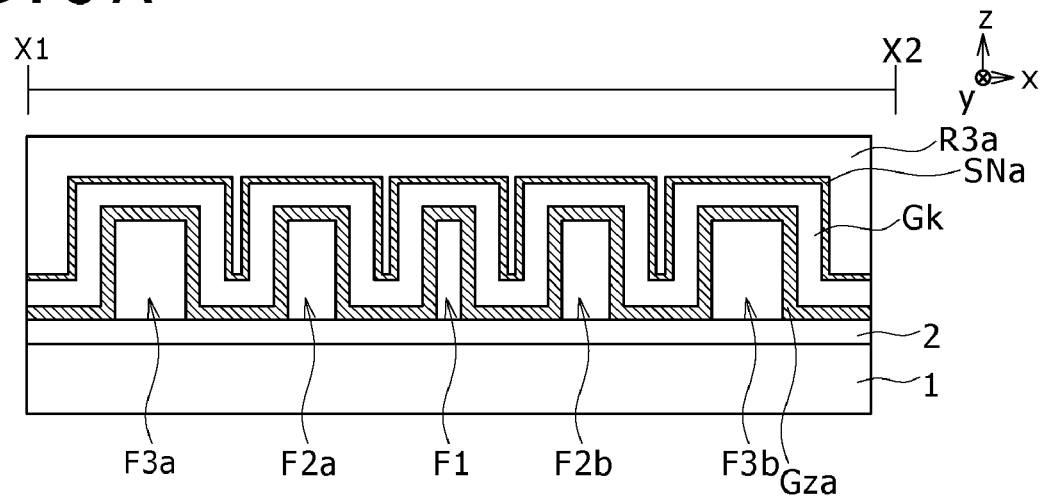
FIGS. 8A and 8B are diagrams showing device major part manufactured in the respective steps in the method for manufacturing the semiconductor device according to the first embodiment of the present embodiment.
Figure 8B:
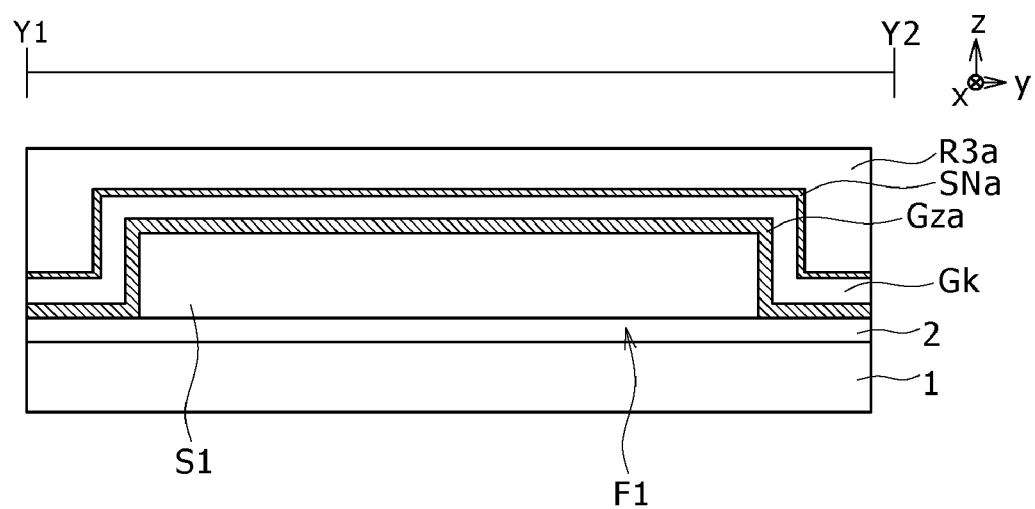

Subsequently, a photoresist film R3a is provided as shown in FIGS. 8A and 8B.

In this step, the photoresist film R3a composed of a photosensitive material is deposited by spin coating on the surface of the silicon nitride film SNa as the pattern-processing target surface as shown in FIGS. 8A and 8B.

Figure 9A:
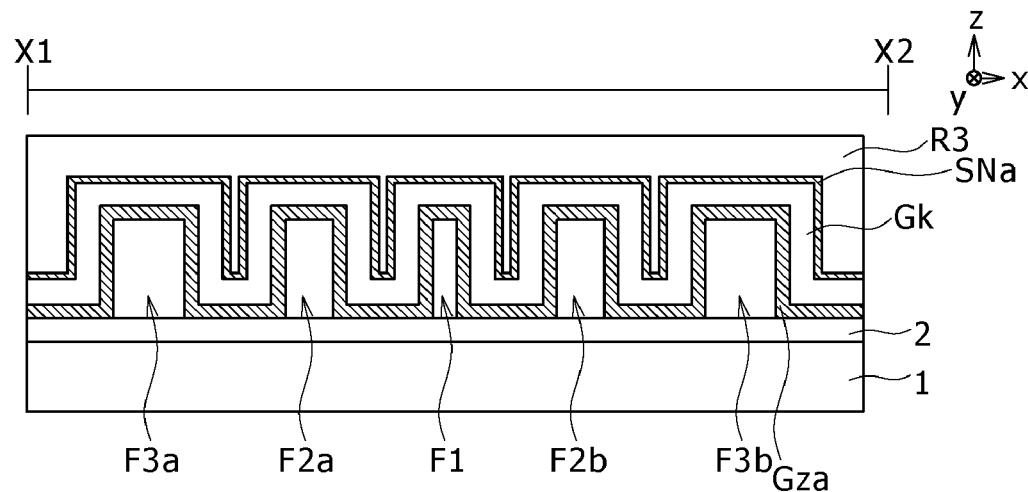
FIGS. 9A and 9B are diagrams showing device major part manufactured in the respective steps in the method for manufacturing the semiconductor device according to the first embodiment of the present embodiment.
Figure 9B:
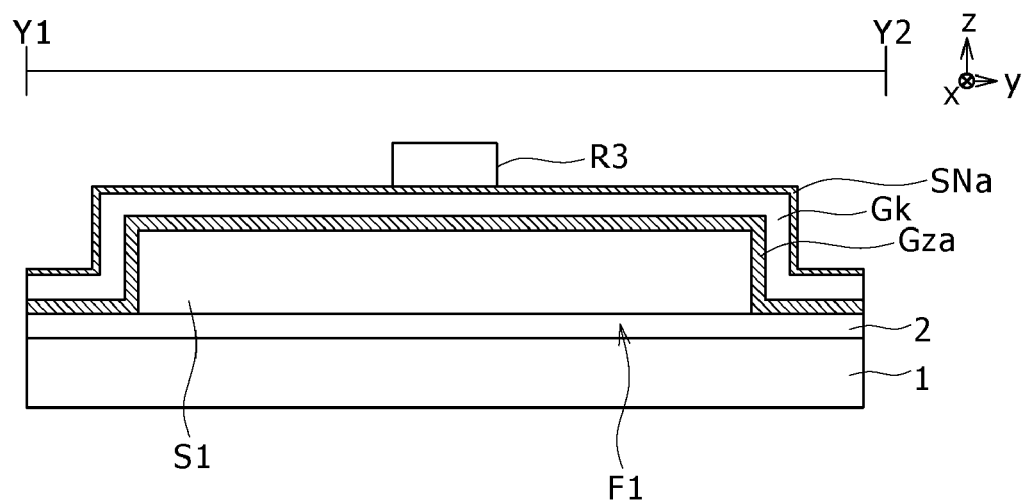

Subsequently, a resist mask R3 is formed as shown in FIGS. 9A and 9B.

In this step, a photomask (not shown) having the mask pattern corresponding to the design pattern is irradiated with light, and a mask pattern image arising due to this light irradiation is transferred to the photoresist film R3a through exposure thereof. Thereafter, the photoresist film R3a to which this mask pattern image has been transferred is developed to form the resist mask R3 as shown in FIGS. 9A and 9B.

In the present embodiment, the photoresist film R3a is so removed and pattern-processed that the surface of the silicon nitride film SNa corresponding to the part in which the gate electrode G and the gate insulating film Gz are to be provided as shown in FIGS. 1 to 3 is covered and the surface of the other part is exposed. This forms the resist mask R3 shown in FIGS. 9A and 9B.

Figure 10A:
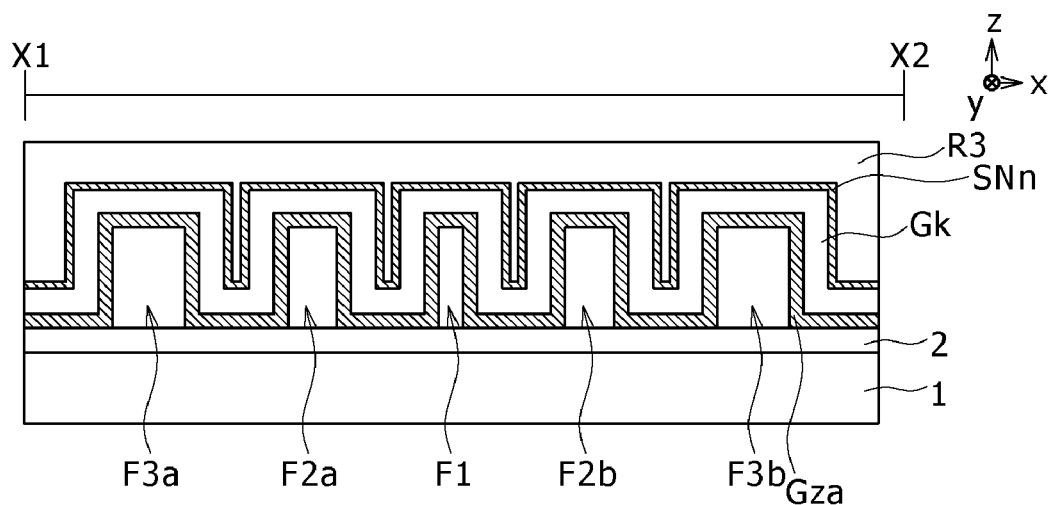
FIGS. 10A and 10B are diagrams showing device major part manufactured in the respective steps in the method for manufacturing the semiconductor device according to the first embodiment of the present embodiment.
Figure 10B:
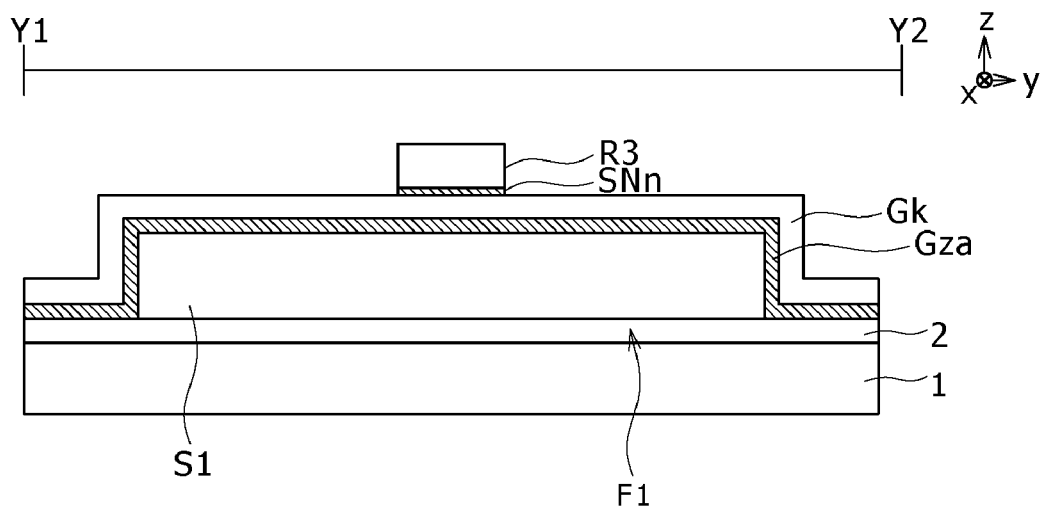

Subsequently, a hard mask SNn is formed as shown in FIGS. 10A and 10B.

In this step, the hard mask SNn is formed by pattern-processing of the silicon nitride film SNa with use of the resist mask R3 as shown in FIGS. 10A and 10B.

For example, etching treatment is performed for the silicon nitride film SNa by RIE until the surface of the metal layer Gk is exposed. For example, $CF_4$-based RIE is performed. By this step, the hark mask SNn is formed from the silicon nitride film SNa.

Figure 11A:
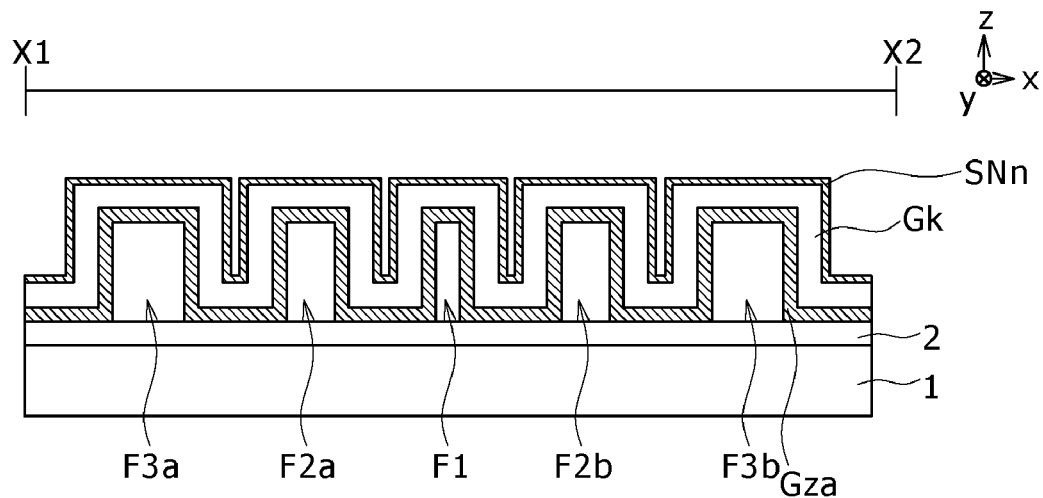
FIGS. 11A and 11B are diagrams showing device major part manufactured in the respective steps in the method for manufacturing the semiconductor device according to the first embodiment of the present embodiment.
Figure 11B:
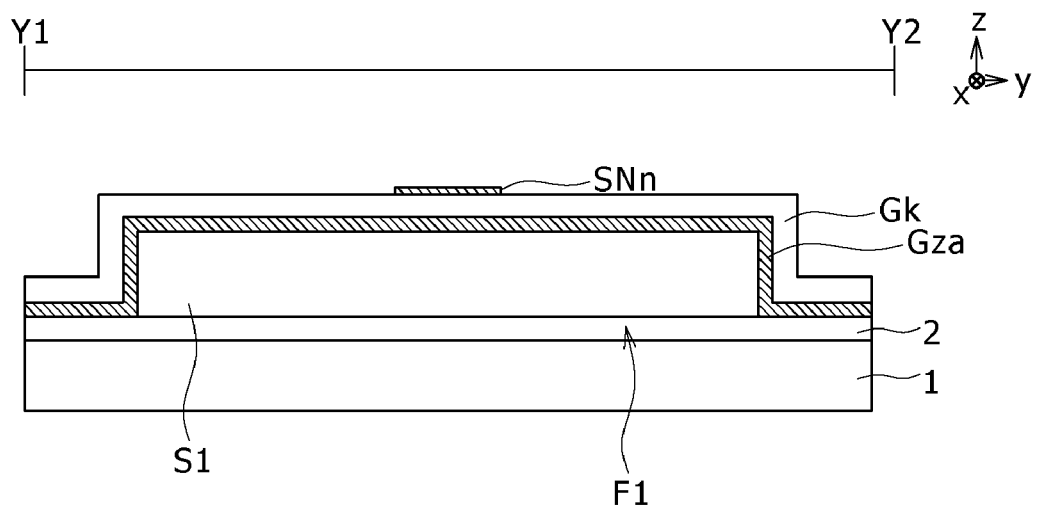

Subsequently, the resist mask R3 is removed as shown in FIGS. 11A and 11B.

For example, ashing treatment is performed to thereby remove the resist mask R3 as shown in FIGS. 11A and 11B.

Figure 12A:
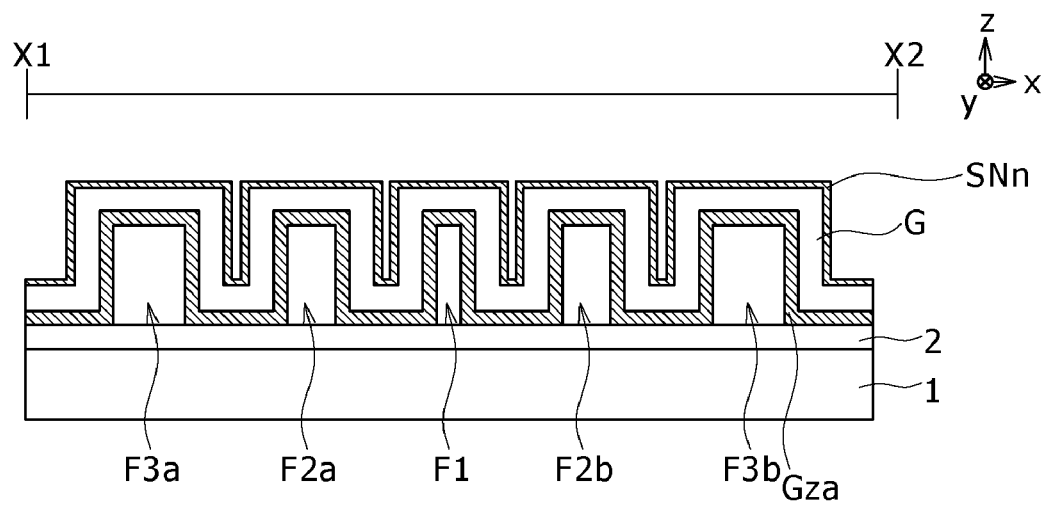
FIGS. 12A and 12B are diagrams showing device major part manufactured in the respective steps in the method for manufacturing the semiconductor device according to the first embodiment of the present embodiment.
Figure 12B:
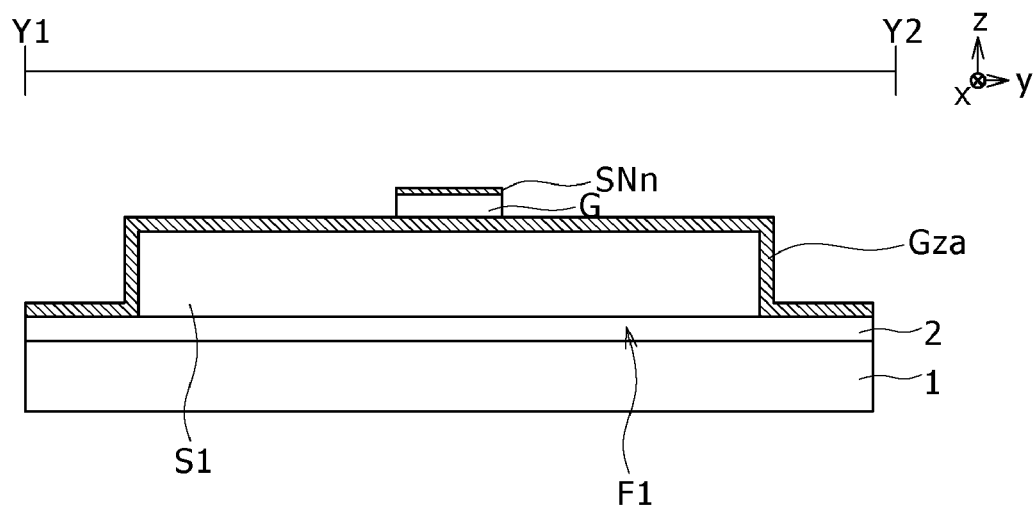

Subsequently, the gate electrode G is formed as shown in FIGS. 12A and 12B.

In this step, the gate electrode G is formed by pattern-processing of the metal layer Gk with use of the hard mask SNn as shown in FIGS. 12A and 12B.

For example, etching treatment is performed for the metal layer Gk by RIE until the surface of the insulating film Gza is exposed. By this step, the gate electrode G is formed from the metal layer Gk.

Figure 13A:
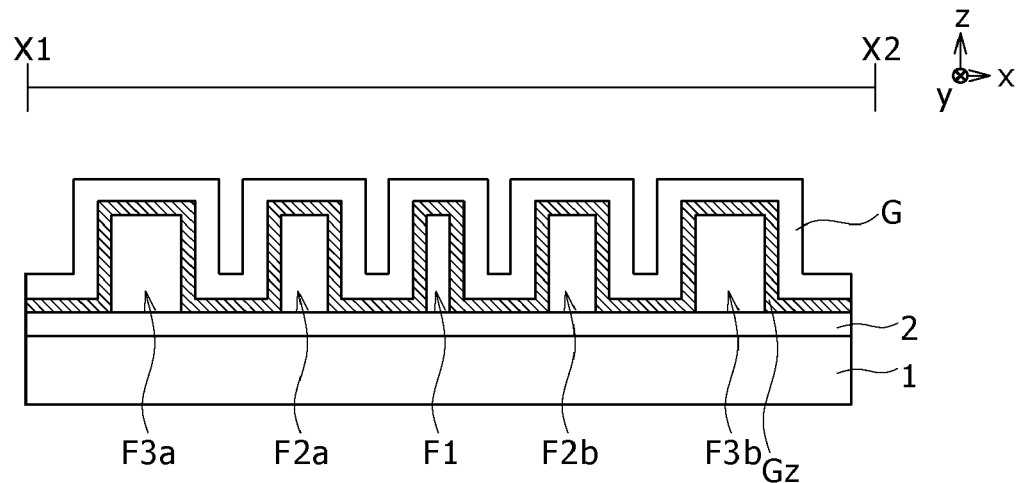
FIGS. 13A and 13B are diagrams showing device major part manufactured in the respective steps in the method for manufacturing the semiconductor device according to the first embodiment of the present embodiment.
Figure 13B:
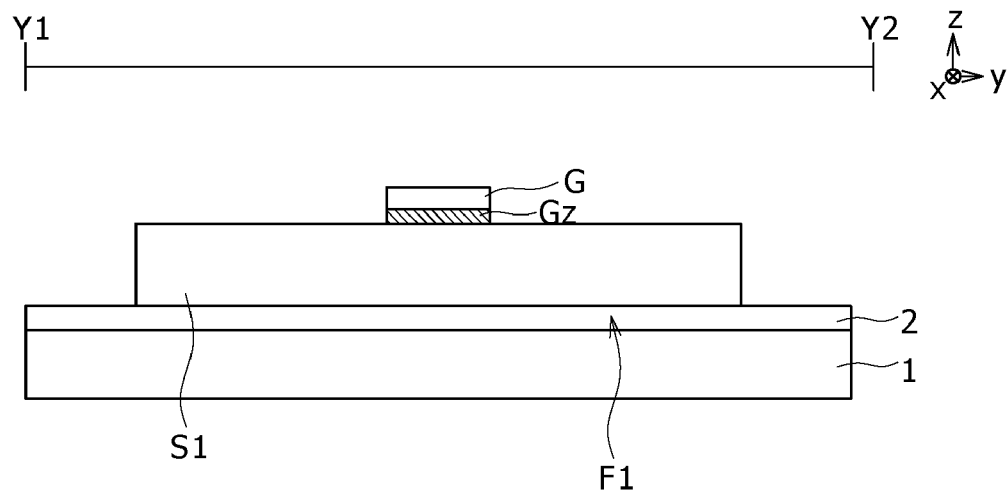

Subsequently, the gate insulating film Gz is formed as shown in FIGS. 13A and 13B.

In this step, the gate insulating film Gz is formed by pattern-processing of the insulating film GZa with use of the gate electrode G as the mask as shown in FIGS. 13A and 13B.

For example, etching treatment is performed for the insulating film Gza by RIE. By this step, the gate insulating film Gz is formed from the insulating film Gza. At this time, the hard mask SNn is removed similarly.

Figure 14A:
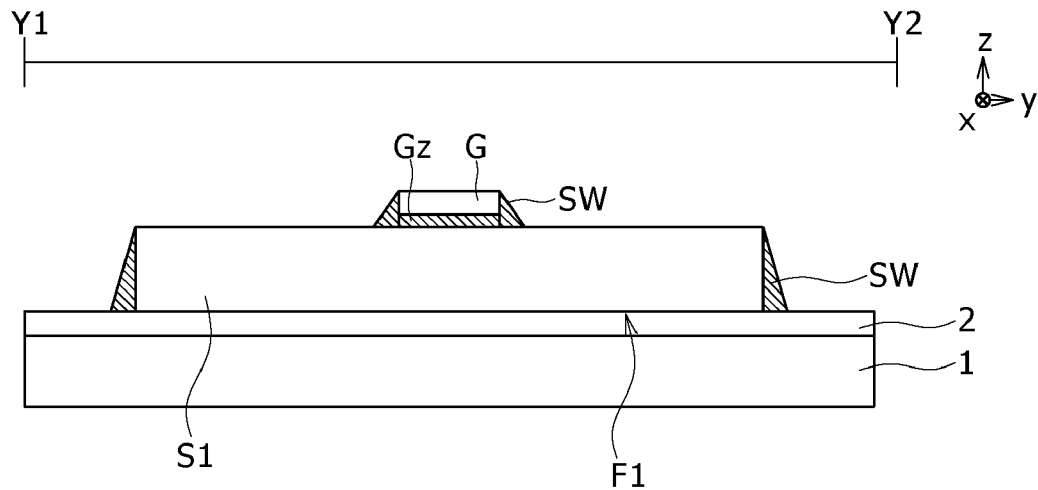
FIGS. 14A to 14E are diagrams showing device major part manufactured in the respective steps in the method for manufacturing the semiconductor device according to the first embodiment of the present embodiment.

Subsequently, the sidewalls SW are formed as shown in FIG. 14A.

In this step, a silicon oxide film (not shown) is so deposited by CVD as to cover the gate electrode G, the first fin F1, and the other fins F2a, F2b, F3a, and F3b for example. Thereafter, etch-back treatment is performed for the silicon oxide film to thereby form the sidewalls SW on the side surfaces of the gate electrode G as shown in FIG. 14A. In addition, the sidewalls SW are formed on the side surfaces of the first fin F1 by this step.

Although not shown in the drawing, the sidewalls SW are also formed on the side surfaces of the respective fins other than the first fin F1, e.g. the fins F2a, F2b, F3a, and F3b, similarly.

Figure 14B:
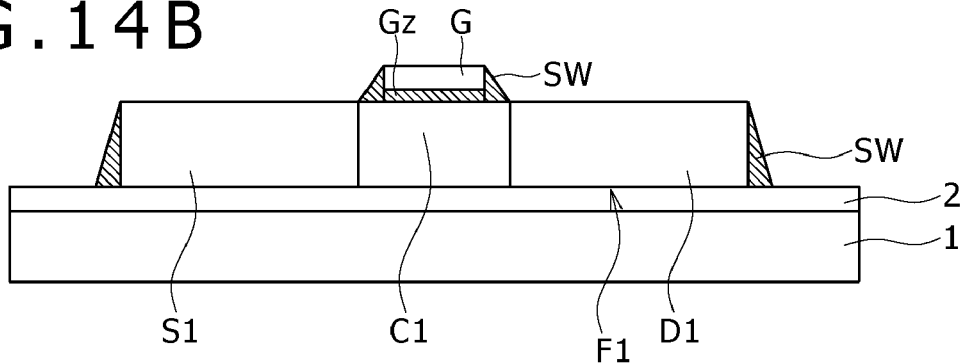

Subsequently, one pair of source/drain regions S1 and D1 are formed as shown in FIG. 14B.

In this step, ion implantation is performed for the part in which the pair of source/drain regions S1 and D1 are to be formed in the first fin F1 as shown in FIG. 14B. Specifically, the ion implantation into the first fin F1 is performed with use of the gate electrode G and the sidewalls SW as the mask. For example, phosphorous (P) ions are implanted in the case of forming this finFET 100 as an N-type FET. On the other hand, e.g. boron (B) ions are implanted in the case of forming this finFET 100 as a P-type FET. Specifically, the ion implantation is performed under conditions of acceleration voltage in the range of 5 to 10 KeV and a dose of about $3\times10^{15}/cm^2$. By this implantation, the pair of source/drain regions S1 and D1 are formed in the first fin F1.

Although not shown in the drawing, the pairs of source/drain regions S2a, D2a, S2b, D2b, S3a, D3a, S3b, and D3b are also formed in the respective fins other than the first fin F1, i.e. the fins F2a, F2b, F3a, and F3b, similarly.

Figure 14C:
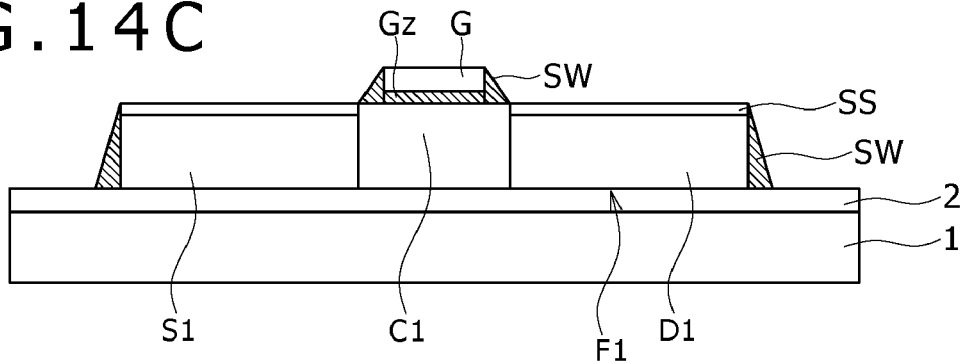

Subsequently, the silicide layer SS is formed as shown in FIG. 14C.

In this step, the silicide layer SS is formed on the surface of the first fin F1 in which the pair of source/drain regions S1 and D1 have been formed as shown in FIG. 14C. Specifically, e.g. cobalt or nickel is deposited by sputtering on the surfaces of the pair of source/drain regions S1 and D1. Thereafter, heat treatment is performed to thereby form the silicide layer SS on the surfaces.

Although not shown in the drawing, also for the respective fins other than the first fin F1, i.e. the fins F2a, F2b, F3a, and F3b, the silicide layer SS is formed on the surfaces of the pairs of source/drain regions S2a, D2a, S2b, D2b, S3a, D3a, S3b, and D3b similarly.

Figure 14D:
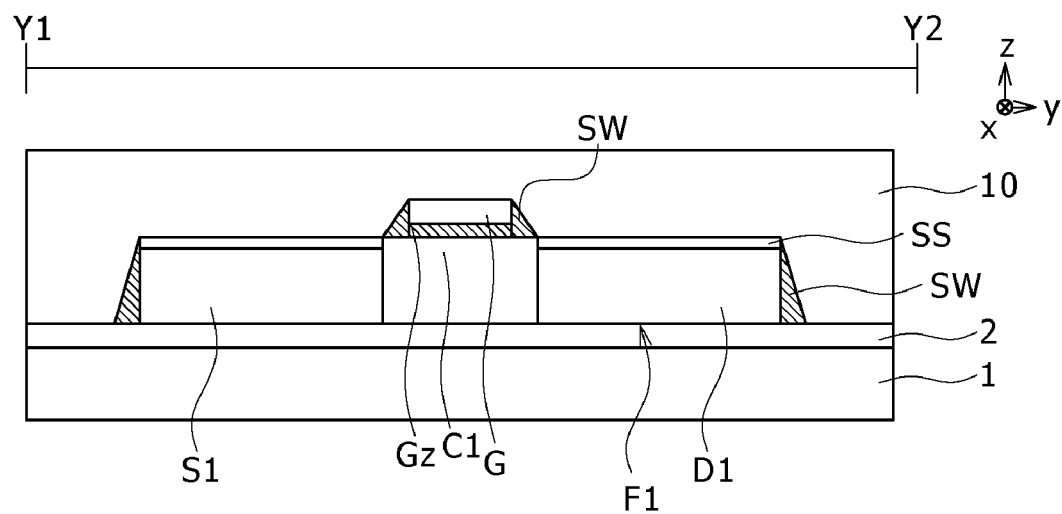

Subsequently, an interlayer insulating film 10 is formed as shown in FIG. 14D.

In this step, a silicon oxide film is so deposited by e.g. CVD as to cover the respective components, and then the surface thereof is planarized by e.g. chemical mechanical polishing (CMP), to thereby form this interlayer insulating film 10. Alternatively, a Low-k film or the like may be formed as the interlayer insulating film 10.

Figure 14E:
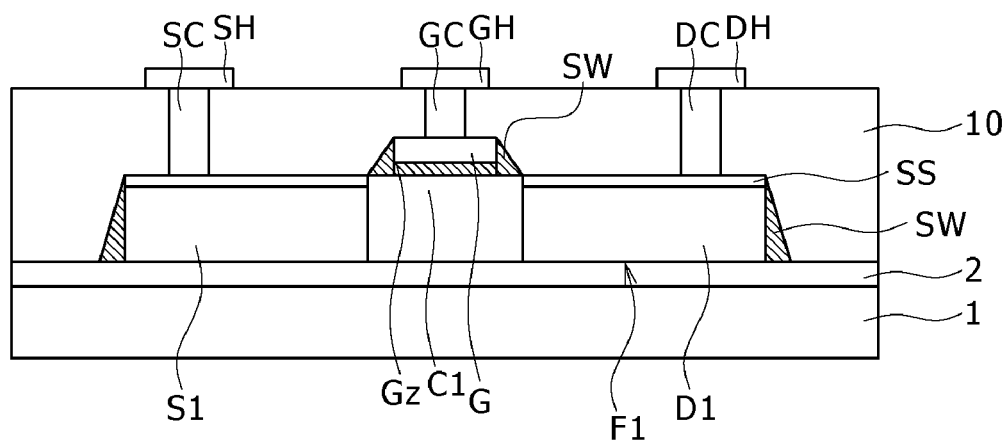

Subsequently, contacts SC, GC, and DC and interconnects SH, GH, and DH are formed as shown in FIG. 14E.

For the formation of these components, contact holes (not shown) are formed in the part corresponding to the pair of source/drain regions S1 and D1 in the interlayer insulating film 10 covering the first fin F1 as shown in FIG. 14E. Specifically, etching treatment is performed for the interlayer insulating film 10 by e.g. RIE in such a way that the surface of the silicide layer SS covering the pair of source/drain regions S1 and D1 is exposed, to thereby form the contact holes (not shown).

Furthermore, similarly thereto, a contact hole (not shown) is formed in the part corresponding to the gate electrode G in the interlayer insulating film 10 covering the first fin F1. Specifically, similarly to the above description, etching treatment is performed for the interlayer insulating film 10 by e.g. RIE in such a way that the surface of the gate electrode G is exposed, to thereby form the contact hole (not shown). In the present embodiment, at the time of the formation of the contact holes in the part corresponding to the pair of source/drain regions S1 and D1, the contact hole in the part corresponding to the gate electrode G is also formed.

Although not shown in the drawing, contact holes (not shown) are formed also for the respective fins other than the first fin F1, e.g. the fins F2a, F2b, F3a, and F3b, similarly to the above description.

Thereafter, a metal material such as aluminum is buried in the respective contact holes and processed to thereby form the respective contacts SC, GC, and DC as shown in FIG. 14E. Specifically, the contacts SC and DC are so formed as to be electrically connected to the pair of source/drain regions S1 and D1. The contact GC is so formed as to be electrically connected to the gate electrode G. In the present embodiment, at the time of the formation of the contacts SC and DC in the part corresponding to the pair of source/drain regions S1 and D1, the contact GC in the part corresponding to the gate electrode G is also formed.

Although not shown in the drawing, the respective contacts SC, GC, and DC are formed also for the respective fins other than the first fin F1, e.g. the fins F2a, F2b, F3a, and F3b, similarly.

Thereafter, the first interconnect SH, the second interconnect DH, and the third interconnect GH are formed as shown in FIG. 14E. In this step, a metal material such as aluminum is deposited and then pattern-processed to thereby form the first interconnect SH, the second interconnect DH, and the third interconnect GH. Specifically, the first interconnect SH and the second interconnect DH are so formed as to be electrically connected to the contacts SC and DC formed for the pair of source/drain regions S1 and D1, respectively. The third interconnect GH is so formed as to be electrically connected to the contact GC formed for the gate electrode G.

Although not shown in the drawing, the first interconnect SH, the second interconnect DH, and the third interconnect GH are formed also for the respective fins other than the first fin F1, e.g. the fins F2a, F2b, F3a, and F3b.

Specifically, the first interconnect SH is so formed as to be electrically connected to the respective contacts SC provided for one source/drain regions S1, S2a, S2b, S3a, and S3b in the fins F1, F2a, F2b, F3a, and F3b.

The second interconnect DH is so formed as to be electrically connected to the respective contacts DC provided for the other source/drain regions D1, D2a, D2b, D3a, and D3b in the fins F1, F2a, F2b, F3a, and F3b.

The third interconnect GH is so formed as to be electrically connected to the respective contacts GC provided corresponding to the gate electrode G for the fins F1, F2a, F2b, F3a, and F3b.

As described above, the finFET 100 of the present embodiment includes the first fin F1, the second fins F2a and F2b, and the third fins F3a and F3b. In this finFET 100, these fins are so formed that the threshold voltage Vth of the first fin F1, the threshold voltage Vth of the second fins F2a and F2b, and the threshold voltage Vth of the third fins F3a and F3b are different from each other. Specifically, the widths W1, W2, and W3 of the first fin F1, the second fins F2a and F2b, and the third fins F3a and F3b, respectively, are different from each other as shown in FIG. 1. This provides the difference in the threshold voltage Vth among them. That is, the finFET 100 of the present embodiment is fabricated as an aggregate of unit finFETs having different threshold voltages Vth.

Figure 15:
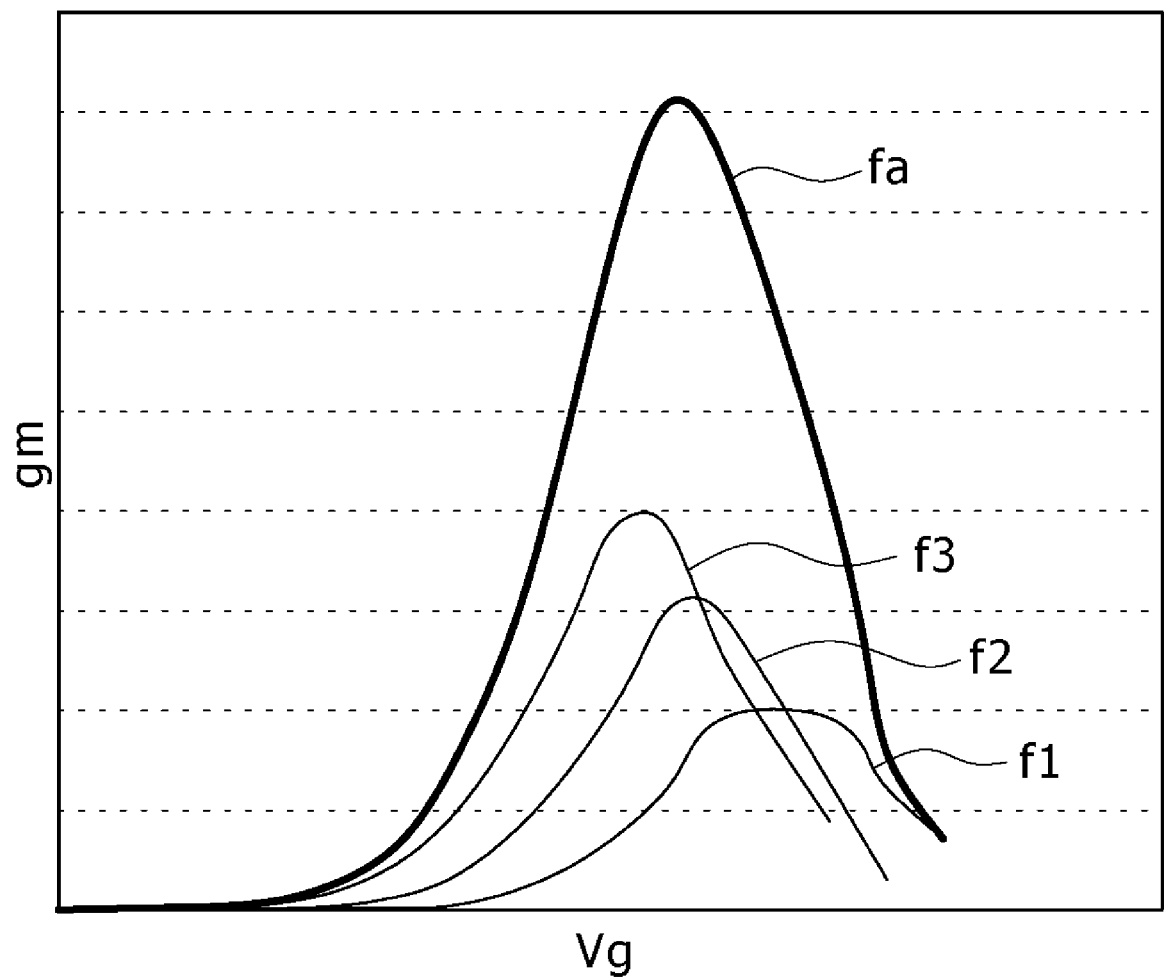
FIG. 15 is a diagram showing the voltage dependence of the transconductance of a finFET in the semiconductor device according to the first embodiment of the present invention.

FIG. 15 is a diagram showing the voltage dependence of the transconductance of the finFET 100 in the semiconductor device according to the first embodiment of the present invention. In FIG. 15, the ordinate indicates the transconductance (gm) and the abscissa indicates the gate voltage (Vg). In FIG. 15, the result about the whole of the finFET 100 is indicated by a heavy solid line fa. The result about the first fin F1 included in the finFET 100 is indicated by a thin solid line f1. Similarly, the result about two second fins F2a and F2b included in the finFET 100 is indicated by a thin solid line f2. Furthermore, the result about two third fins F3a and F3b included in the finFET 100 is indicated by a thin solid line f3.

As shown in FIG. 15, in the first fin F1 (solid line f1), the maximum value of the transconductance gm is smaller and the gate voltage Vg corresponding to this maximum value is higher compared with the second fins F2a and F2b (solid line f2). In the second fins F2a and F2b (solid line f2), the maximum value of the transconductance (gm) is smaller and the gate voltage Vg corresponding to this maximum value is higher compared with the third fins F3a and F3b (solid line f3).

That is, as the width of the fin is increased, the transconductance gm becomes higher and the gate voltage Vg yielding the rise of the transconductance gm decreases.

Therefore, the transconductance (gm) of the finFET 100 having the respective fins F1, F2a, F2b, F3a, and F3b is equivalent to the synthesis of the respective results (f1, f2, f3) as shown by the heavy solid line fa in FIG. 15.

Thus, the finFET 100 of the present embodiment has a lower degree of the decrease of the transconductance gm from its peak compared with a finFET composed of any one of the first fin F1, the second fins F2a and F2b, and the third fins F3a and F3b. That is, the curve indicating the voltage dependence of the transconductance gm is flatter.

Thus, the present embodiment can achieve widening of the band of the gain in a high-frequency RFIC.

Furthermore, in the finFET 100 of the present embodiment, change in the transconductance gm dependent on the gate voltage Vg is smaller compared with a finFET composed of any one of the first fin F1, the second fins F2a and F2b, and the third fins F3a and F3b as shown in FIG. 15. That is, the linearity is enhanced.

Thus, the present embodiment can achieve reduction in the distortion of the element characteristics.

Moreover, in the present embodiment, each of the first fin F1, the second fins F2a and F2b, and the third fins F3a and F3b extends along the y direction. Furthermore, along the x direction, two second fins F2a and F2b are so arranged as to sandwich the first fin F1 at the center, at intervals. That is, two second fins F2a and F2b are arranged symmetrically in the x direction about the first fin F1. Furthermore, two third fins F3a and F3b are so arranged as to sandwich the first fin F1 at the center in the x direction, at intervals through the second fins F2a and F2b. That is, two third fins F3a and F3b are arranged symmetrically in the x direction about the first fin F1.

In this manner, five fins F1, F2a, F2b, F3a, and F3b are arranged with a pattern symmetric in the x direction in the present embodiment.

Thus, the finFET 100 of the present embodiment has no bias in the distribution of the electric field strength, the current distribution, and the heat distribution at the time of the operation, and therefore is allowed to have enhanced reliability and suppressed characteristic variation.

Thus, the present embodiment is useful to enhance the functions and the integration degree and reduce the cost for a wireless module for a mobile communication terminal in particular.

In the above description of the present embodiment, ion implantation is performed for the channel forming regions of the respective fins F1, F2a, F2b, F3a, and F3b. However, the present invention is not limited thereto. For example, a non-doped structure obtained without the ion implantation into the channel forming regions of the respective fins F1, F2a, F2b, F3a, and F3b may be employed. This can achieve higher-speed operation.

Second Embodiment

A second embodiment of the present invention will be described below.

(Structure)

Figure 16:
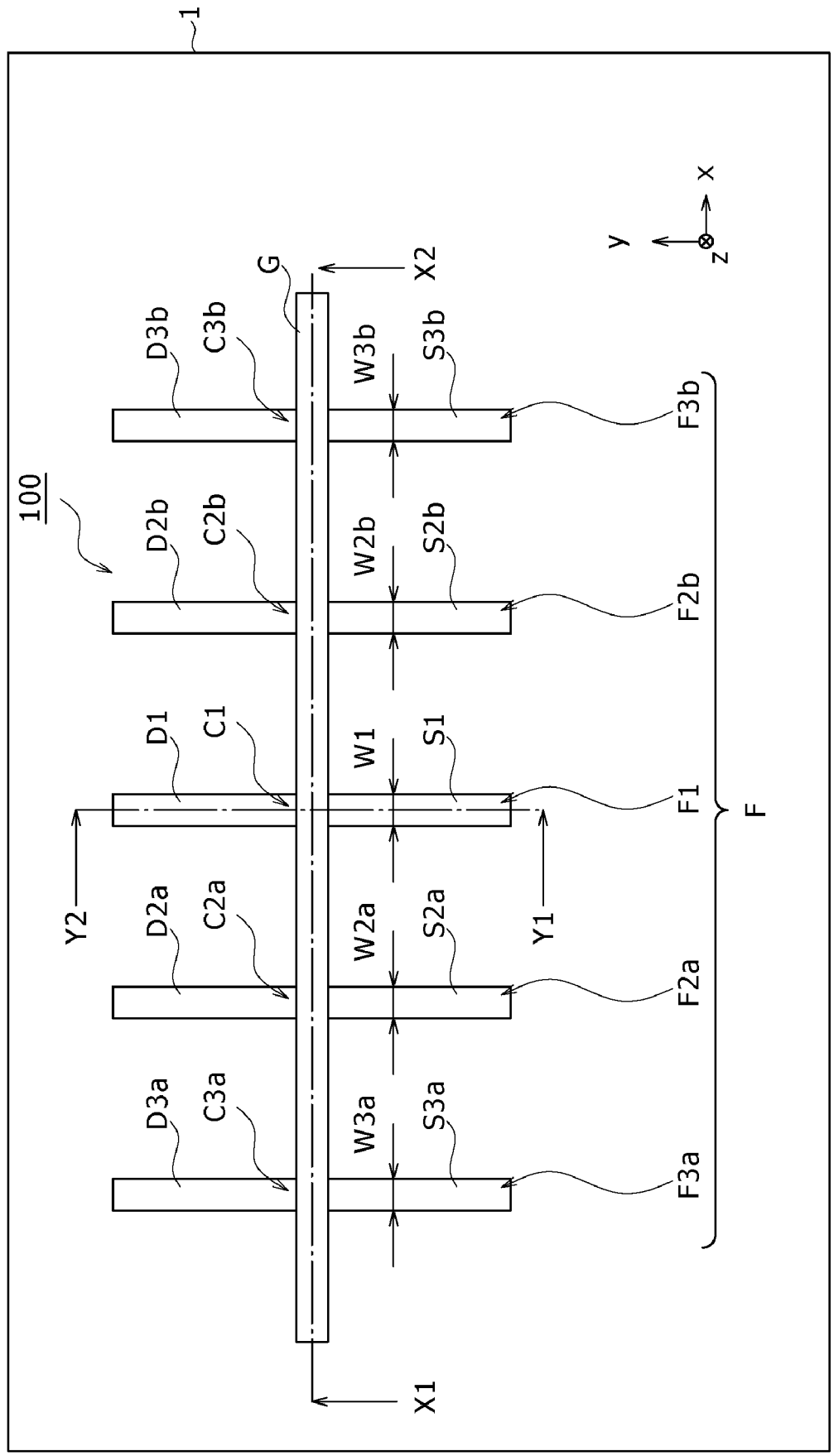
FIG. 16 is a plan view showing major part of a semiconductor device according to a second embodiment of the present invention.

FIG. 16 is a plan view showing major part of a semiconductor device according to the second embodiment of the present invention.

Figure 17:
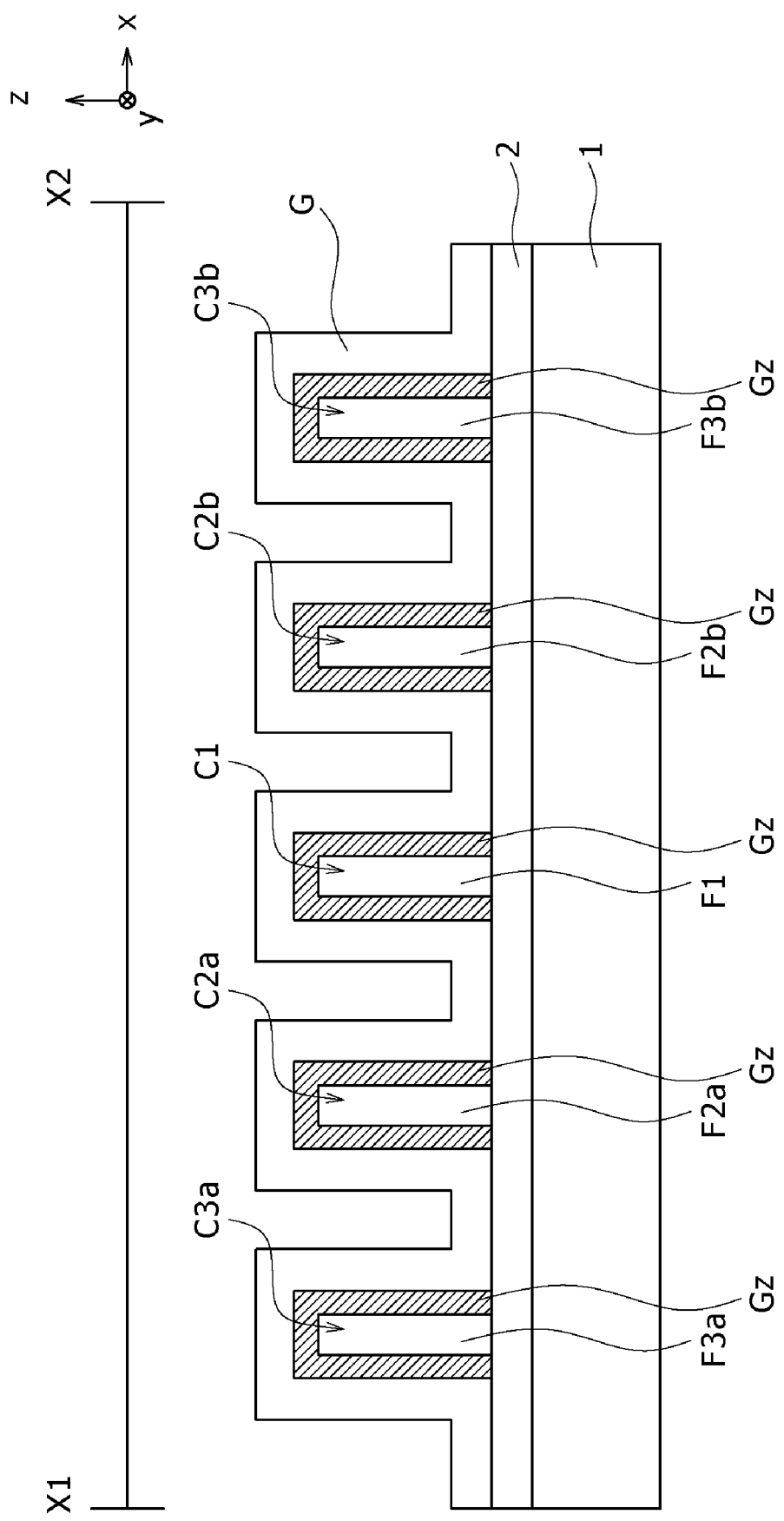
FIG. 17 is a sectional view schematically showing major part of the semiconductor device according to the second embodiment of the present invention.

FIGS. 17 and 18 are sectional views schematically showing major part of the semiconductor device according to the second embodiment of the present invention.

Specifically, FIG. 17 is a sectional view corresponding to the plane that is along line X1-X2 in FIG. 16 and perpendicular to the paper plane of FIG. 16. FIG. 18 is a sectional view corresponding to the plane that is along line Y1-Y2 in FIG. 16 and perpendicular to the paper plane of FIG. 16.

The present embodiment is different from the first embodiment in the fins F included in the finFET 100 as shown in FIGS. 16 to 18. Except for this feature, the second embodiment is the same as the first embodiment. Therefore, the description of the overlapping part is omitted.

In the finFET 100 of the present embodiment, the fins F include five fins F1, F2a, F2b, F3a, and F3b as shown in FIG. 16, similarly to the first embodiment. Each of five fins F1, F2a, F2b, F3a, and F3b extends in a line manner along the y direction of the xy plane of the substrate 1 as shown in FIG. 16. These five fins F1, F2a, F2b, F3a, and F3b are juxtaposed to each other at intervals along the x direction.

In the finFET 100 of the present embodiment, as shown in FIG. 17, the buried oxide film 2 is formed on the xy plane of the substrate 1 and each of five fins F1, F2a, F2b, F3a, and F3b protrudes from the surface of the buried oxide film 2, similarly to the first embodiment. These five fins F1, F2a, F2b, F3a, and F3b are identical to each other in the height of this protrusion in the z direction.

However, in the present embodiment, five fins F1, F2a, F2b, F3a, and F3b are so formed that their widths W1, W2, and W3 extending along the y direction of the xy plane are identical to each other as shown in FIGS. 16 and 17.

Specifically, the width W1 of the first fin F1 located at the center in the x direction is the same as the width W2 of each of two second fins F2a and F2b adjacent to the first fin F1. Furthermore, the width W1 of the first fin F1 at the center in the x direction is the same as the width W3 of each of two third fins F3a and F3b adjacent to the first fin F1 through the second fins F2a and F2b. In this finFET 100, each of five fins F1, F2a, F2b, F3a, and F3b has the same width as the width W1 of the first fin F1 in the first embodiment.

Furthermore, in the fins F, the first fin F1 at the center in the x direction is so formed as to have threshold voltage Vth different from that of two second fins F2a and F2b adjacent to the first fin F1, similarly to the first embodiment. In addition, the first fin F1 at the center in the x direction is so formed as to have the threshold voltage Vth different from that of two third fins F3a and F3b located at both the ends in the x direction. Moreover, the threshold voltage Vth is made different also between two second fins F2a and F2b adjacent to the first fin F1 at the center and two third fins F3a and F3b at both the ends in the x direction.

In the present embodiment, the doping amounts of the impurity element in the channel forming region are so adjusted as to be different from each other among the first fin F1, the second fins F2a and F2b, and the third fins F3a and F3b, to thereby make the threshold voltages Vth of the fins different from each other.

For example, of five fins F1, F2a, F2b, F3a, and F3b, for the first fin F1 at the center in the x direction, boron is ion-implanted with a doping amount of $2.5 \times 10^{12}/cm^2$ for example.

For each of two second fins F2a and F2b adjacent to the first fin F1 along the x direction, boron is ion-implanted with a doping amount of $2.0 \times 10^{12}/cm^2$ for example.

For each of two third fins F3a and F3b at both the ends in the x direction, boron is ion-implanted with a doping amount of $1.5 \times 10^{12}/cm^2$ for example.

For these five fins F1, F2a, F2b, F3a, and F3b, the gate insulating film Gz is provided as shown in FIGS. 17 and 18, similarly to the first embodiment.

Furthermore, the gate electrode G is so provided as to intersect with five fins F1, F2a, F2b, F3a, and F3b as shown in FIG. 16, similarly to the first embodiment. Specifically, the gate electrode G extends along the x direction of the xy plane of the substrate 1 and is at right angles to each of five fins F1, F2a, F2b, F3a, and F3b.

(Manufacturing Method)

Major part of a method for manufacturing the above-described semiconductor device in the present embodiment will be described below.

FIGS. 19A to 19E and 20 are diagrams showing device major part manufactured in the respective steps in the method for manufacturing the semiconductor device according to the second embodiment of the present embodiment.

Specifically, FIGS. 19A to 19E include sectional views corresponding to the plane that is along line X1-X2 in FIG. 16 and perpendicular to the paper plane of FIG. 16, similarly to FIG. 17. FIG. 20 is a perspective view.

Figure 19A:
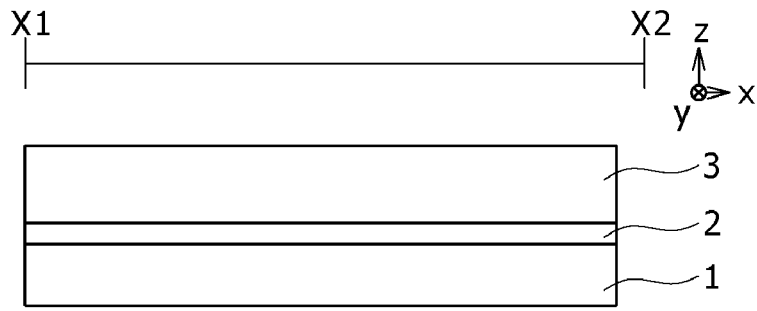
FIGS. 19A to 19E are diagrams showing device major part manufactured in the respective steps in a method for manufacturing the semiconductor device according to the second embodiment of the present embodiment.
Figure 20:
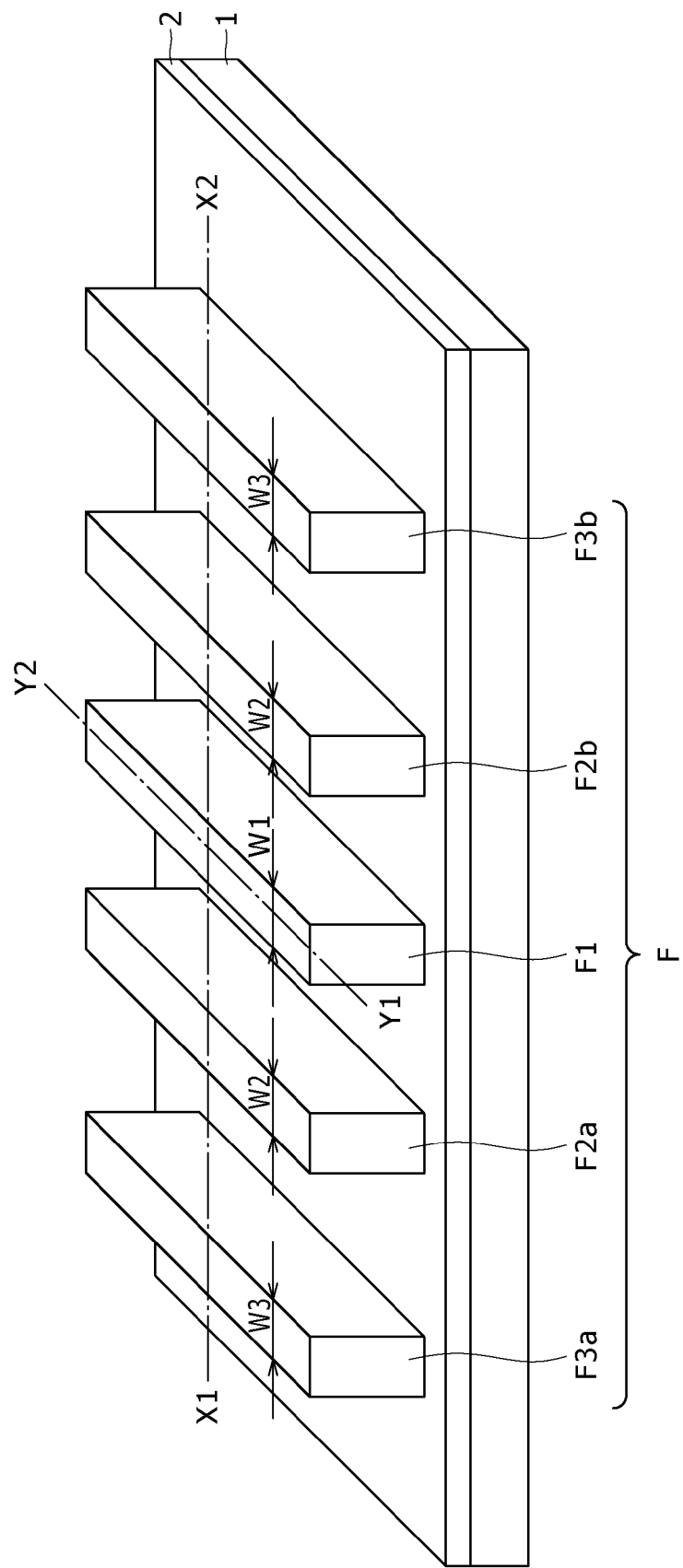
FIG. 20 is a diagram showing device major part manufactured in the respective steps in the method for manufacturing the semiconductor device according to the second embodiment of the present embodiment.

First, as shown in FIG. 19A, the buried oxide film 2 and the semiconductor layer 3 are provided over the surface of the substrate 1.

In this step, similarly to the first embodiment, oxygen ions are implanted into a position deep from the surface of the substrate 1 composed of a silicon semiconductor and heat treatment is performed to thereby form the buried oxide film 2 formed of a silicon oxide film on the substrate 1. In addition, the semiconductor layer 3 composed of a silicon semiconductor is provided on the surface of the buried oxide film 2. That is, an SOI substrate based on a SIMOX structure is prepared.

Figure 19B:
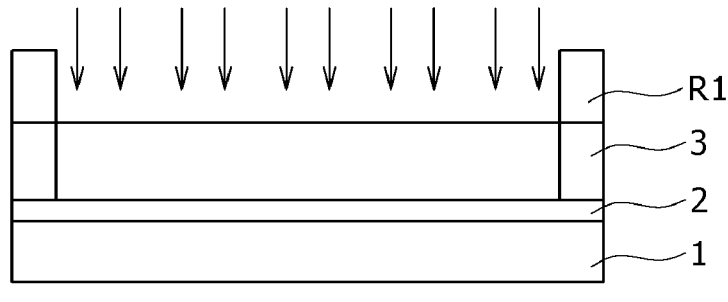

Subsequently, ion implantation into the semiconductor layer 3 is performed with use of a resist mask R1 as shown in FIG. 19B.

In this step, the resist mask R1 is provided that has an aperture corresponding to the region in which the respective channel forming regions C1, C2a, C2b, C3a, and C3b of five fins F1, F2a, F2b, F3a, and F3b are to be provided in the semiconductor layer 3 as shown in FIG. 17. Specifically, similarly to the first embodiment, a photoresist film (not shown) composed of a photosensitive material is deposited on the entire surface of the semiconductor layer 3, and then this photoresist film is pattern-processed by photolithography, to thereby provide this resist mask R1.

Thereafter, with use of this resist mask R1, the ion implantation is performed for the region in which the channel forming regions C1, C2a, C2b, C3a, and C3b of five fins F1, F2a, F2b, F3a, and F3b are to be provided. For example, boron (B) is ion-implanted with a dose of $1.5 \times 10^{12}/cm^2$.

Subsequently, the resist mask R1 is removed.

Figure 19C:
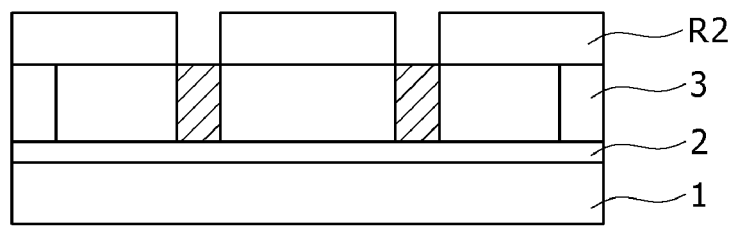

Subsequently, ion implantation into the semiconductor layer 3 is performed with use of a resist mask R2 as shown in FIG. 19C.

In this step, the resist mask R2 is provided that has an aperture corresponding to the region in which the channel forming regions C2a and C2b of the second fins F2a and F2b of five fins F1, F2a, F2b, F3a, and F3b are to be provided in the semiconductor layer 3 as shown in FIG. 17. Specifically, a photoresist film (not shown) composed of a photosensitive material is deposited on the entire surface of the semiconductor layer 3, and then this photoresist film is pattern-processed by photolithography, to thereby provide this resist mask R2.

Thereafter, the ion implantation into the semiconductor layer 3 is performed with use of the resist mask R2. For example, boron (B) is ion-implanted with a dose of $2.0 \times 10^{12}/cm^2$.

Subsequently, the resist mask R2 is removed.

Figure 19D:
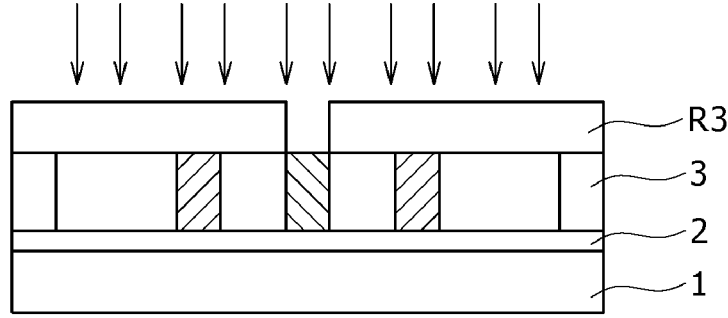

Subsequently, ion implantation into the semiconductor layer 3 is performed with use of a resist mask R3 as shown in FIG. 19D.

In this step, the resist mask R3 is provided that has an aperture corresponding to the region in which the channel forming region C1 of the first fin F1 of five fins F1, F2a, F2b, F3a, and F3b is to be provided in the semiconductor layer 3 as shown in FIG. 17. Specifically, a photoresist film (not shown) composed of a photosensitive material is deposited on the entire surface of the semiconductor layer 3, and then this photoresist film is pattern-processed by photolithography, to thereby provide this resist mask R3.

Thereafter, the ion implantation into the semiconductor layer 3 is performed with use of the resist mask R3. For example, boron (B) is ion-implanted with a dose of $2.5 \times 10^{12}/cm^2$.

Subsequently, the resist mask R3 is removed.

Figure 19E:
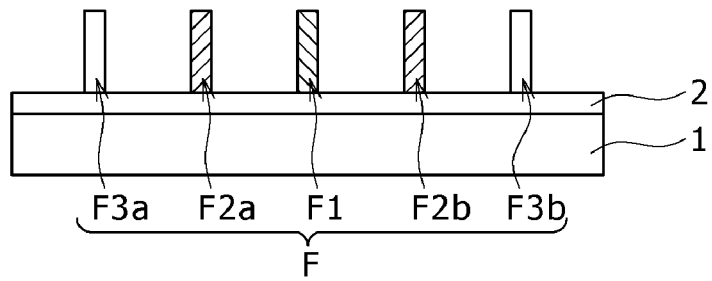

Subsequently, the fins F are formed as shown in FIG. 19E.

Specifically, the semiconductor layer 3 is so pattern-processed as to correspond to the planar shape of the fins F shown in FIG. 16.

For example, a hard mask (not shown) corresponding to this pattern shape is formed similarly to the first embodiment. Thereafter, etching treatment for the semiconductor layer 3 is performed with use of this hard mask to thereby pattern-process the semiconductor layer 3 as described above.

This forms five fins F1, F2a, F2b, F3a, and F3b shown in FIG. 20. Specifically, five fins F1, F2a, F2b, F3a, and F3b are so formed that their widths W1, W2, and W3 extending along the y direction of the xy plane are identical to each other as shown in FIG. 20.

Subsequently, the respective components such as the gate electrode G and the gate insulating film Gz are formed as shown in FIGS. 17 and 18.

In this step, the respective components such as the gate electrode G and the gate insulating film Gz are formed similarly to the first embodiment.

Specifically, an insulating film (not shown) and a metal layer (not shown) are sequentially deposited over the substrate 1 in such a manner as to cover the fins F. Thereafter, a hard mask (not shown) corresponding to the pattern shape of the gate electrode G shown in FIG. 16 is formed on the metal film. Subsequently, the metal layer is subjected to etching treatment with use of this hard mask so as to be pattern-processed, to thereby form the gate electrode G. By this step, the gate electrode G having the pattern shape shown in FIG. 16 is formed.

Furthermore, similarly to the first embodiment, the gate insulating film Gz is formed as shown in FIGS. 17 and 18 by pattern-processing of the insulating film with use of the gate electrode G as the mask.

Thereafter, similarly to the first embodiment, the sidewalls SW are formed on the side surfaces of the gate electrode G and on the side surfaces of each of the fins F1, F2a, F2b, F3a, and F3b as shown in FIG. 18. Furthermore, similarly to the first embodiment, the pairs of source/drain regions S1, D1, S2a, D2a, S2b, D2b, S3a, D3a, S3b, and D3b are formed in the respective fins F1, F2a, F2b, F3a, and F3b as shown in FIG. 18. Furthermore, similarly to the first embodiment, the silicide layer SS is formed on the surfaces of the pairs of source/drain regions S1, D1, S2a, D2a, S2b, D2b, S3a, D3a, S3b, and D3b in the respective fins F1, F2a, F2b, F3a, and F3b as shown in FIG. 18. Although FIG. 18 shows the first fin F1, the other fins, i.e. the second fins F2a and F2b and the third fins F3a and F3b have the same structure as that of the first fin F1 except that the doping amount of the channel forming region is different as described above.

Also in the present embodiment, the contacts SC, GC, and DC and the interconnects SH, GH, and DH are formed after the interlayer insulating film 10 is formed, similarly to the above description of the first embodiment with FIG. 14E.

As described above, in the finFET 100 of the present embodiment, the dose of the channel forming region is different among the first fin F1, the second fins F2a and F2b, and the third fins F3a and F3b. Thus, in the present embodiment, the threshold voltage Vth is different among the first fin F1, the second fins F2a and F2b, and the third fins F3a and F3b.

Figure 21:
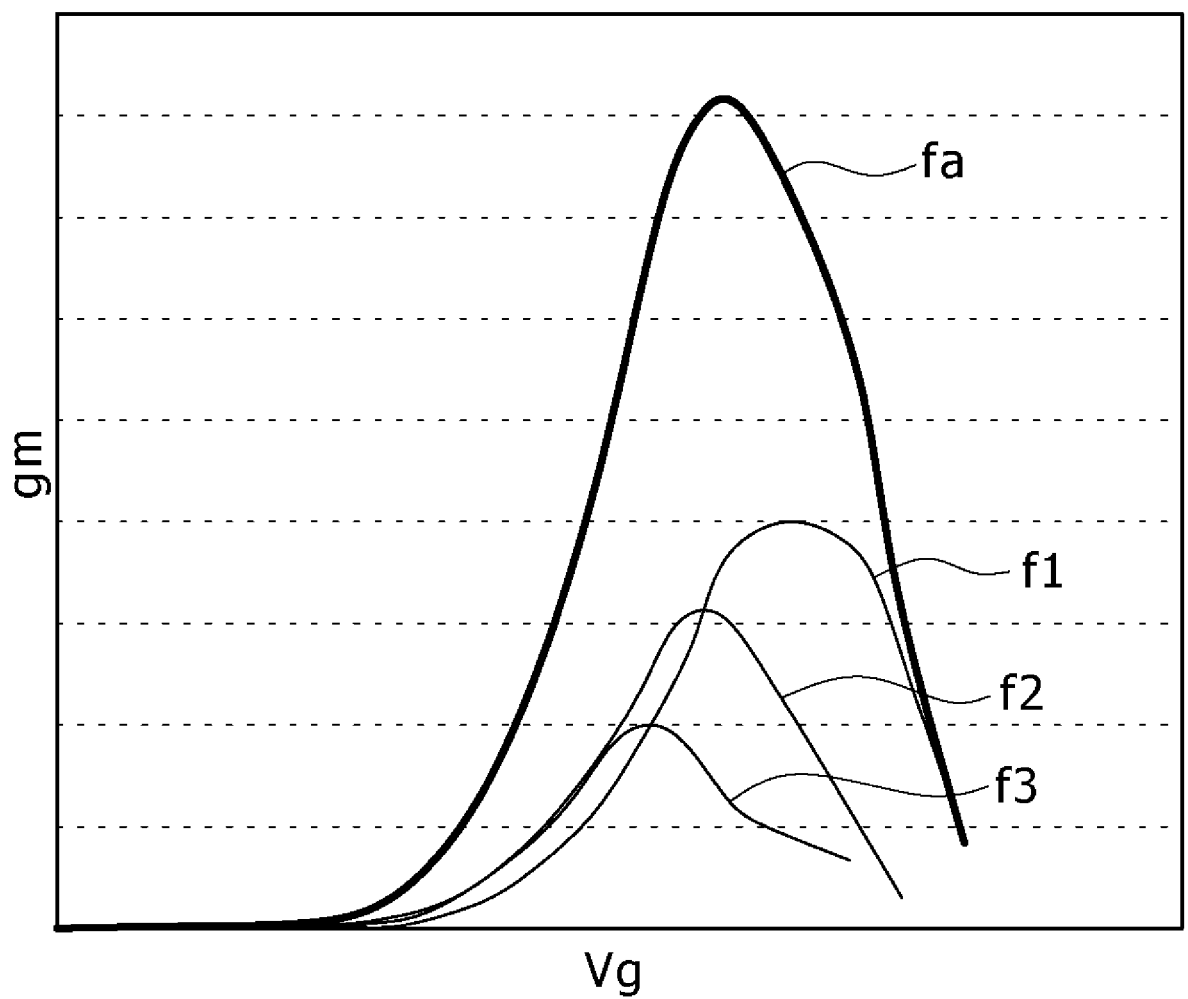
FIG. 21 is a diagram showing the voltage dependence of the transconductance of a finFET in the semiconductor device according to the second embodiment of the present invention.

FIG. 21 is a diagram showing the voltage dependence of the transconductance of the finFET 100 in the semiconductor device according to the second embodiment of the present invention. In FIG. 21, the ordinate indicates the transconductance (gm) and the abscissa indicates the gate voltage (Vg). In FIG. 21, the result about the whole of the finFET 100 is indicated by a heavy solid line fa. The result about the first fin F1 included in the finFET 100 is indicated by a thin solid line f1. Similarly, the result about two second fins F2a and F2b included in the finFET 100 is indicated by a thin solid line f2. Furthermore, the result about two third fins F3a and F3b included in the finFET 100 is indicated by a thin solid line f3.

As shown in FIG. 21, in the first fin F1 (solid line f1), the maximum value of the transconductance gm is larger and the gate voltage Vg corresponding to this maximum value is also higher compared with the second fins F2a and F2b (solid line f2). In the second fins F2a and F2b (solid line f2), the maximum value of the transconductance (gm) is larger and the gate voltage Vg corresponding to this maximum value is also higher compared with the third fins F3a and F3b (solid line f3).

That is, as the impurity concentration of the channel forming region in the fin is increased, the transconductance gm becomes higher and the gate voltage Vg yielding the rise of the transconductance gm increases.

The transconductance gm of the finFET 100 having the respective fins F1, F2a, F2b, F3a, and F3b is equivalent to the synthesis of the respective results (f1, f2, f3) as shown by the heavy solid line fa in FIG. 21.

Thus, the finFET 100 of the present embodiment has a lower degree of the decrease of the transconductance gm from its peak compared with a finFET composed of any of the first fin F1, the second fins F2a and F2b, and the third fins F3a and F3b, similarly to the first embodiment. That is, the curve indicating the voltage dependence of the transconductance gm is flatter.

Thus, the present embodiment can achieve widening of the band of the gain in a high-frequency RFIC similarly to the first embodiment. Furthermore, the present embodiment can achieve reduction in the distortion of the element characteristics.

In addition, in the present embodiment, five fins F1, F2a, F2b, F3a, and F3b are so arranged that the concentrations of the impurity ions implanted into the channel forming region are symmetric with each other in the x direction.

Thus, the finFET 100 of the present embodiment has reduced bias in the distribution of the electric field strength, the current distribution, and the heat distribution at the time of the operation, and therefore is allowed to have enhanced reliability and suppressed characteristic variation, similarly to the first embodiment.

Third Embodiment

A third embodiment of the present invention will be described below.

(Structure)

Figure 22:
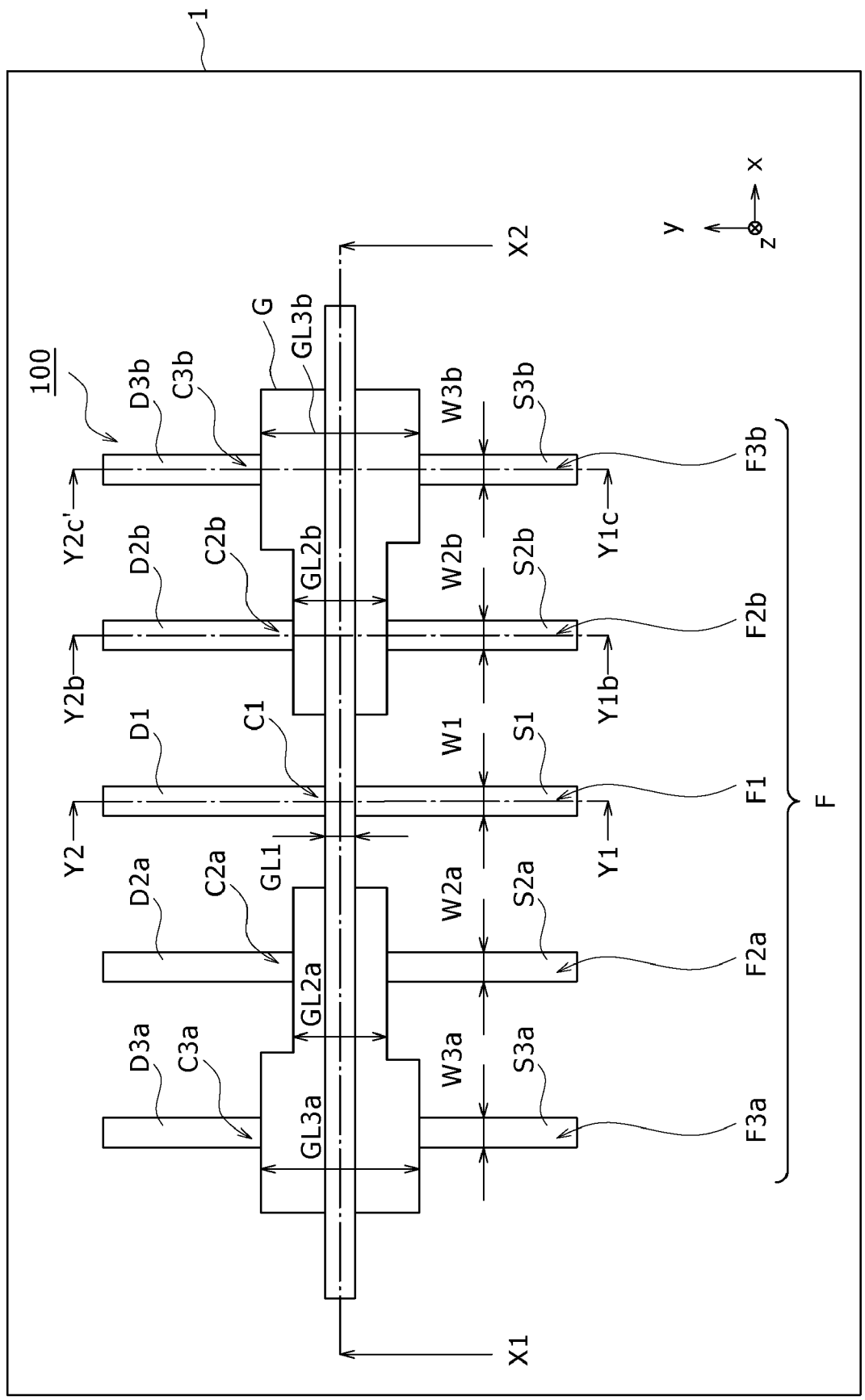
FIG. 22 is a plan view showing major part of a semiconductor device according to a third embodiment of the present invention.

FIG. 22 is a plan view showing major part of a semiconductor device according to the third embodiment of the present invention.

FIGS. 23 and 24A to 24C are sectional views schematically showing major part of the semiconductor device according to the third embodiment of the present invention.

Figure 23:
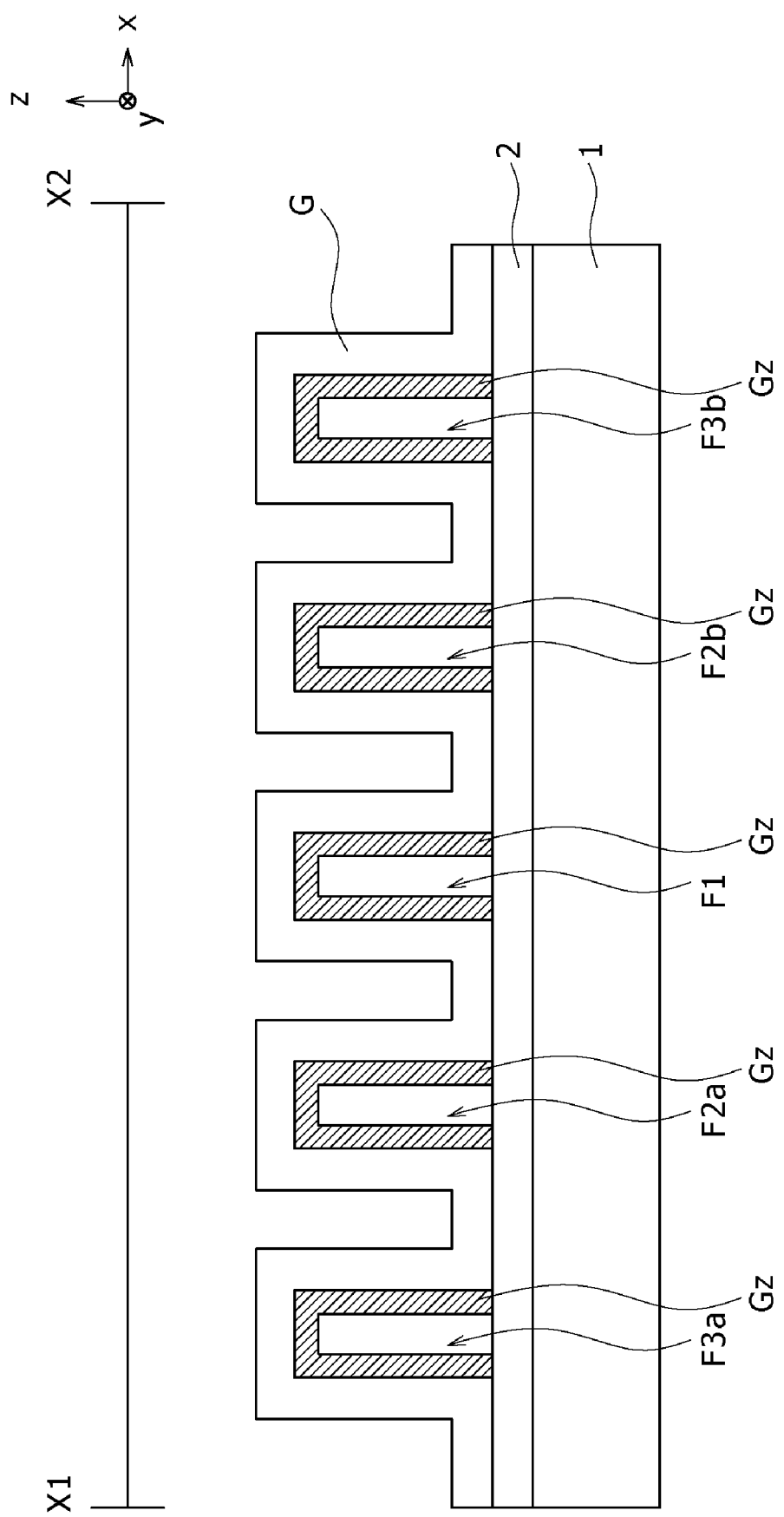
FIG. 23 is a sectional view schematically showing major part of the semiconductor device according to the third embodiment of the present invention.
Figure 24A:
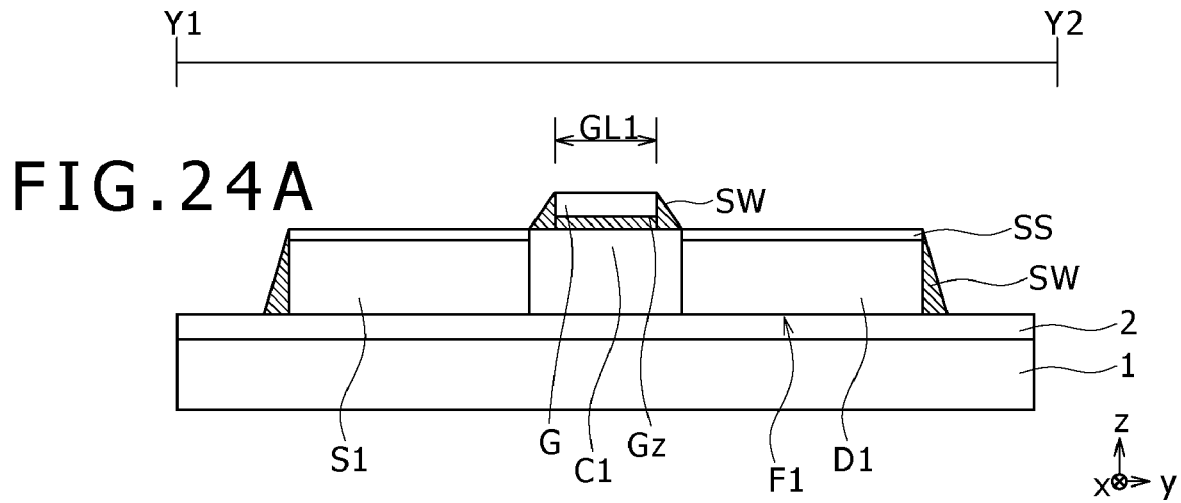
FIGS. 24A to 24C are sectional views schematically showing major part of the semiconductor device according to the third embodiment of the present invention.
Figure 24B:
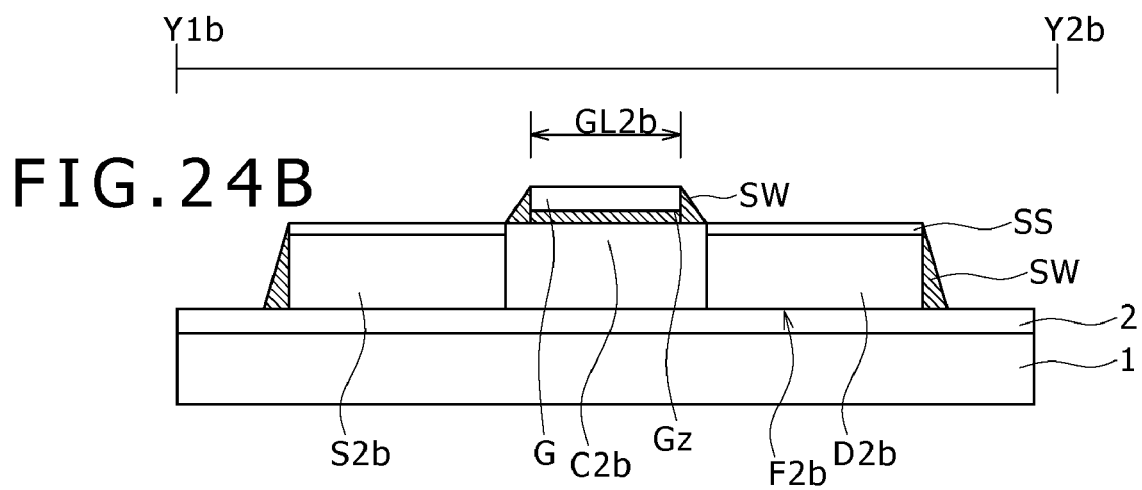
Figure 24C:
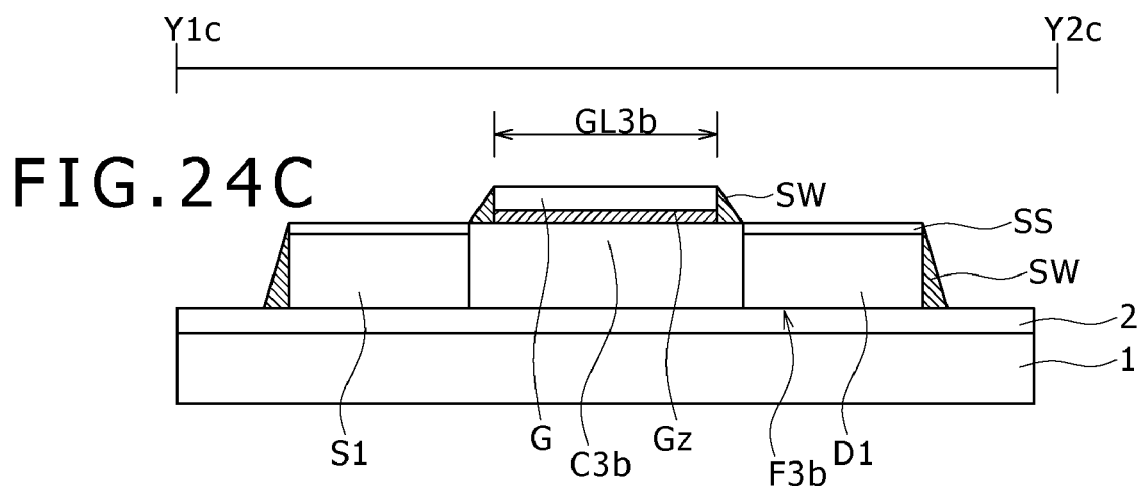

Specifically, FIG. 23 is a sectional view corresponding to the plane that is along line X1-X2 in FIG. 22 and perpendicular to the paper plane of FIG. 22. FIG. 24A is a sectional view corresponding to the plane that is along line Y1-Y2 in FIG. 22 and perpendicular to the paper plane of FIG. 22. FIG. 24B is a sectional view corresponding to the plane that is along line Y1b-Y2b in FIG. 22 and perpendicular to the paper plane of FIG. 22. FIG. 24C is a sectional view corresponding to the plane that is along line Y1c-Y2c in FIG. 22 and perpendicular to the paper plane of FIG. 22.

The present embodiment is different from the first embodiment in the shapes of the fins F included in the finFET 100 as shown in FIGS. 22, 23 and 24A to 24C. Furthermore, the present embodiment is different from the first embodiment in the shape of the gate electrode G of the finFET 100. Except for this feature, the third embodiment is the same as the first embodiment. Therefore, the description of the overlapping part is omitted.

In the finFET 100 of the present embodiment, the fins F include five fins F1, F2a, F2b, F3a, and F3b as shown in FIG. 22, similarly to the first embodiment. Each of five fins F1, F2a, F2b, F3a, and F3b extends in a line manner along the y direction of the xy plane of the substrate 1 as shown in FIG. 22. These five fins F1, F2a, F2b, F3a, and F3b are juxtaposed to each other at intervals along the x direction.

In the finFET 100 of the present embodiment, as shown in FIG. 23, the buried oxide film 2 is formed on the xy plane of the substrate 1 and each of five fins F1, F2a, F2b, F3a, and F3b protrudes from the surface of the buried oxide film 2, similarly to the first embodiment. These five fins F1, F2a, F2b, F3a, and F3b are identical to each other in the height of this protrusion in the z direction.

However, five fins F1, F2a, F2b, F3a, and F3b are so formed that their widths W1, W2, and W3 extending along the y direction of the xy plane are identical to each other as shown in FIGS. 22 and 23.

Specifically, the width W1 of the first fin F1 located at the center in the x direction is the same as the width W2 of each of two second fins F2a and F2b adjacent to the first fin F1. Furthermore, the width W1 of the first fin F1 at the center in the x direction is the same as the width W3 of each of two third fins F3a and F3b adjacent to the first fin F1 through the second fins F2a and F2b. In this finFET 100, each of five fins F1, F2a, F2b, F3a, and F3b has the same width as the width W1 of the first fin F1 in the first embodiment.

For these five fins F1, F2a, F2b, F3a, and F3b, the gate insulating film Gz is provided as shown in FIGS. 23 and 24A to 24C, similarly to the first embodiment.

Furthermore, the gate electrode G is so provided as to intersect with five fins F1, F2a, F2b, F3a, and F3b as shown in FIG. 22. Specifically, the gate electrode G extends along the x direction of the xy plane of the substrate 1 and is at right angles to each of five fins F1, F2a, F2b, F3a, and F3b.

Furthermore, in the finFET 100, the first fin F1 at the center in the x direction is so formed as to have threshold voltage Vth different from that of two second fins F2a and F2b adjacent to the first fin F1, similarly to the first embodiment. In addition, the first fin F1 at the center in the x direction is so formed as to have the threshold voltage Vth different from that of two third fins F3a and F3b located at both the ends in the x direction. Moreover, the threshold voltage Vth is made different also between two second fins F2a and F2b adjacent to the first fin F1 at the center and two third fins F3a and F3b at both the ends in the x direction.

In the present embodiment, the gate electrode G is so formed that the gate length is different among the first fin F1, the second fins F2a and F2b, and the third fins F3a and F3b, to thereby make the threshold voltages Vth of the fins different from each other.

Specifically, of five fins F1, F2a, F2b, F3a, and F3b, for the first fin F1 at the center in the x direction, the gate length GL1 thereof is set to e.g. 200 nm. Specifically, the gate electrode G is so formed that the width of the gate electrode G extending along the x direction is set to this value at the intersecting part of the gate electrode G with the first fin F1 as shown in FIGS. 22 and 24A.

Furthermore, for two second fins F2a and F2b adjacent to the first fin F1 along the x direction, the gate lengths GL2a and GL2b thereof are set larger than the gate length GL1 of the first fin F1 as shown in FIGS. 22 and 24B. In this finFET 100, the gate lengths GL2a and GL2b of the second fins F2a and F2b are set larger by e.g. 70 nm than the gate length GL1 of the first fin F1. Specifically, the gate electrode G is so formed that the width of the gate electrode G extending along the x direction is set to this value at the intersecting parts of the gate electrode G with the second fins F2a and F2b as shown in FIGS. 22 and 24B.

For two third fins F3a and F3b at both the ends in the x direction, the gate lengths GL3a and GL3b thereof are set larger than the gate lengths GL1, GL2a, and GL2b of the first and second fins F1, F2a, and F2b as shown in FIGS. 22 and 24C. In this finFET 100, the gate lengths GL3a and GL3b of the third fins F3a and F3b are set larger by e.g. 70 nm than the gate lengths GL2a and GL2b of the second fins F2a and F2b. Specifically, the gate electrode G is so formed that the width of the gate electrode G extending along the x direction is set to this value at the intersecting parts of the gate electrode G with the third fins F3a and F3b as shown in FIGS. 22 and 24C.

(Manufacturing Method)

Major part of a method for manufacturing the above-described semiconductor device in the present embodiment will be described below.

FIGS. 25A to 25C and 26 are diagrams showing device major part manufactured in the respective steps in the method for manufacturing the semiconductor device according to the third embodiment of the present embodiment.

Figure 25A:
FIGS. 25A to 25C are diagrams showing device major part manufactured in the respective steps in a method for manufacturing the semiconductor device according to the third embodiment of the present embodiment.
Figure 25B:
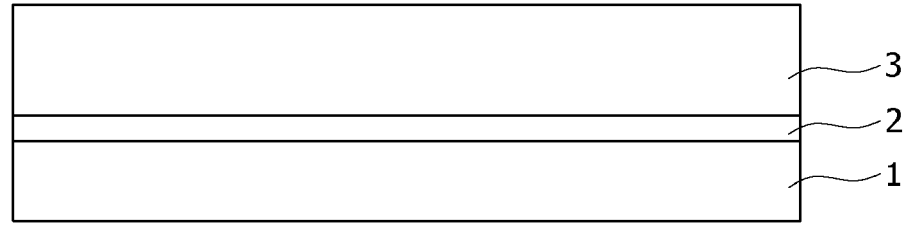
Figure 25C:
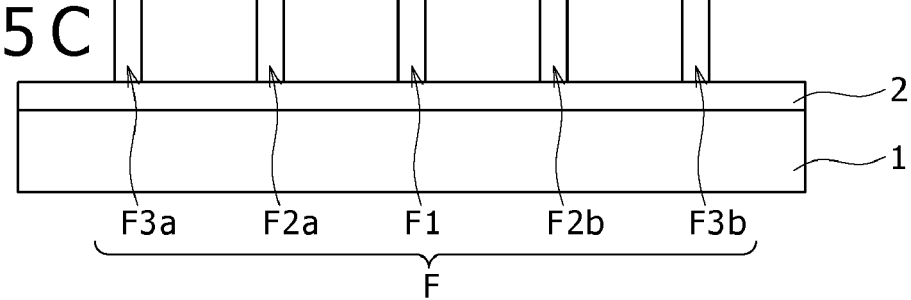
Figure 26:
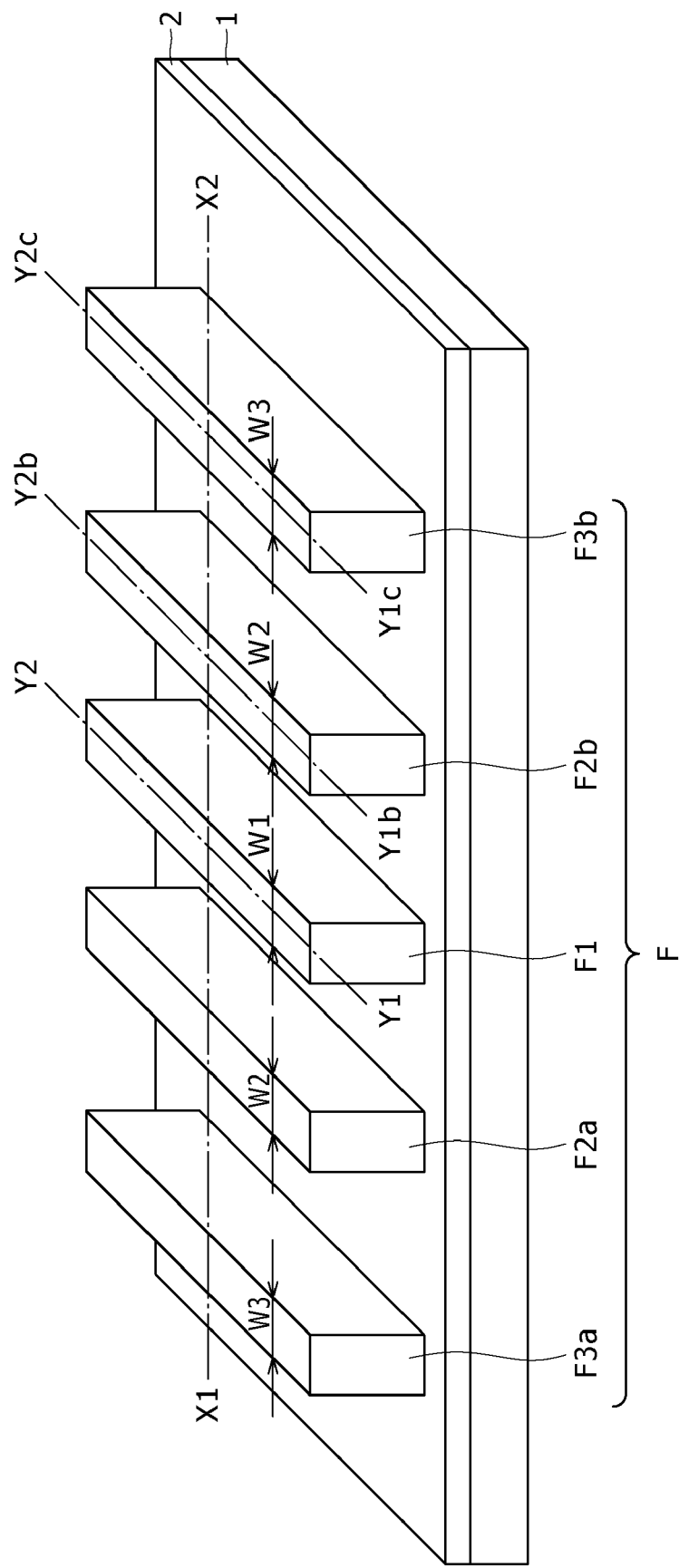
FIG. 26 is a diagram showing device major part manufactured in the respective steps in the method for manufacturing the semiconductor device according to the third embodiment of the present embodiment.

Specifically, FIGS. 25A to 25C includes sectional views corresponding to the plane that is along line X1-X2 in FIG. 22 and perpendicular to the paper plane of FIG. 22, similarly to FIG. 23. FIG. 26 is a perspective view.

First, as shown in FIG. 25A, the buried oxide film 2 and the semiconductor layer 3 are provided over the surface of the substrate 1.

In this step, similarly to the first embodiment, oxygen ions are implanted into a position deep from the surface of the substrate 1 composed of a silicon semiconductor and heat treatment is performed to thereby form the buried oxide film 2 formed of a silicon oxide film on the substrate 1. In addition, the semiconductor layer 3 composed of a silicon semiconductor is provided on the surface of the buried oxide film 2. That is, an SOI substrate based on a SIMOX structure is prepared.

Subsequently, ion implantation into the semiconductor layer 3 is performed with use of a resist mask R1 as shown in FIG. 25B.

In this step, the resist mask R1 is provided that has an aperture corresponding to the region in which the respective channel forming regions C1, C2a, C2b, C3a, and C3b of five fins F1, F2a, F2b, F3a, and F3b are to be provided in the semiconductor layer 3 as shown in FIG. 23. Specifically, similarly to the first embodiment, a photoresist film (not shown) composed of a photosensitive material is deposited on the entire surface of the semiconductor layer 3, and then this photoresist film is pattern-processed by photolithography, to thereby provide this resist mask R1.

Thereafter, with use of this resist mask R1, the ion implantation is performed for the region in which the channel forming regions C1, C2a, C2b, C3a, and C3b of five fins F1, F2a, F2b, F3a, and F3b are to be provided. For example, boron (B) is ion-implanted with a dose of $2.0 \times 10^{12}/cm^2$.

Subsequently, the resist mask R1 is removed.

Subsequently, the fins F are formed as shown in FIG. 25C.

Specifically, the semiconductor layer 3 is so pattern-processed as to correspond to the planar shape of the fins F shown in FIG. 22.

For example, a hard mask (not shown) corresponding to this pattern shape is formed similarly to the first embodiment. Thereafter, etching treatment for the semiconductor layer 3 is performed with use of this hard mask to thereby pattern-process the semiconductor layer 3 as described above.

This forms five fins F1, F2a, F2b, F3a, and F3b shown in FIG. 26. Specifically, five fins F1, F2a, F2b, F3a, and F3b are so formed that their widths W1, W2, and W3 extending along the y direction of the xy plane are identical to each other as shown in FIG. 26.

Subsequently, the respective components such as the gate electrode G and the gate insulating film Gz are formed as shown in FIGS. 23 and 24A to 24C.

In this step, the respective components such as the gate electrode G and the gate insulating film Gz are formed similarly to the first embodiment.

Specifically, an insulating film (not shown) and a metal layer (not shown) are sequentially deposited over the substrate 1 in such a manner as to cover the fins F. Thereafter, a hard mask (not shown) corresponding to the pattern shape of the gate electrode G shown in FIG. 22 is formed on the metal film. Subsequently, the metal layer is subjected to etching treatment with use of this hard mask so as to be pattern-processed, to thereby form the gate electrode G. By this step, the gate electrode G having the pattern shape shown in FIG. 22 is formed.

Furthermore, similarly to the first embodiment, the gate insulating film Gz is formed as shown in FIGS. 23 and 24A to 24C by pattern-processing of the insulating film with use of the gate electrode G as the mask.

Thereafter, similarly to the first embodiment, the sidewalls SW are formed on the side surfaces of the gate electrode G and on the side surfaces of each of the fins F1, F2a, F2b, F3a, and F3b as shown in FIGS. 24A to 24C. Furthermore, similarly to the first embodiment, the pairs of source/drain regions S1, D1, S2a, D2a, S2b, D2b, S3a, D3a, S3b, and D3b are formed in the respective fins F1, F2a, F2b, F3a, and F3b as shown in FIGS. 24A to 24C. Furthermore, similarly to the first embodiment, the silicide layer SS is formed on the surfaces of the pairs of source/drain regions S1, D1, S2a, D2a, S2b, D2b, S3a, D3a, S3b, and D3b in the respective fins F1, F2a, F2b, F3a, and F3b as shown in FIGS. 24A to 24C.

Although FIG. 24B shows one second fin F2b of two second fins F2a and F2b, the other second fin F2a has the same structure as that of this one second fin F2b. Furthermore, although FIG. 24C shows one third fin F3b of two third fins F3a and F3b, the other third fin F3a has the same structure as that of this one third fin F3b.

Subsequently, the contacts SC, GC, and DC and the interconnects SH, GH, and DH are formed after the interlayer insulating film 10 is formed, similarly to the above description of the first embodiment with FIG. 14E.

As described above, in the finFET 100 of the present embodiment, the gate length is different among the first fin F1, the second fins F2a and F2b, and the third fins F3a and F3b. Thus, in the present embodiment, the threshold voltage Vth is different among the first fin F1, the second fins F2a and F2b, and the third fins F3a and F3b.

Figure 27:
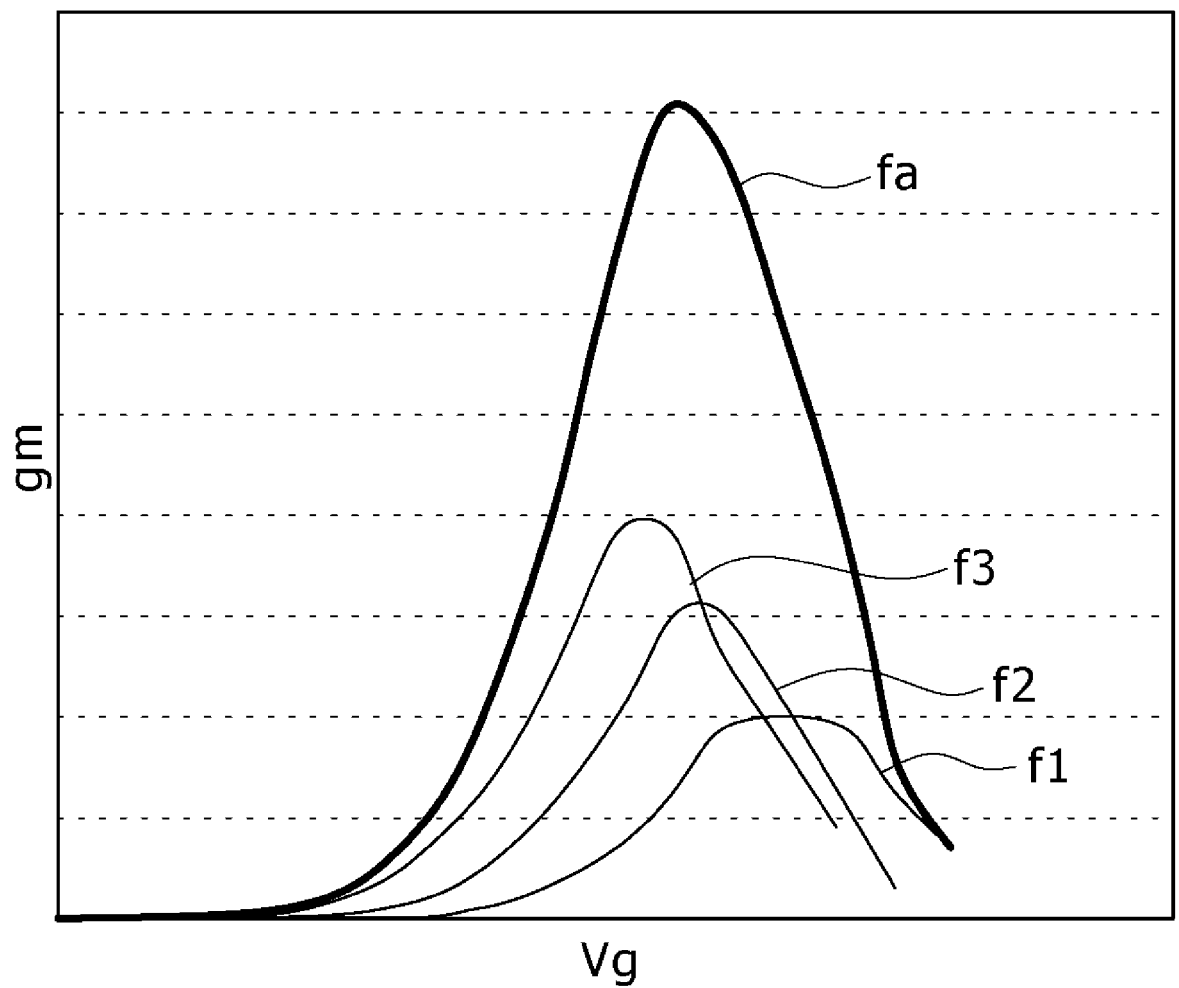
FIG. 27 is a diagram showing the voltage dependence of the transconductance of a finFET in the semiconductor device according to the third embodiment of the present invention.

FIG. 27 is a diagram showing the voltage dependence of the transconductance of the finFET 100 in the semiconductor device according to the third embodiment of the present invention. In FIG. 27, the ordinate indicates the transconductance (gm) and the abscissa indicates the gate voltage (Vg). In FIG. 27, the result about the whole of the finFET 100 is indicated by a heavy solid line fa. The result about the first fin F1 included in the finFET 100 is indicated by a thin solid line f1. Similarly, the result about two second fins F2a and F2b included in the finFET 100 is indicated by a thin solid line f2. Furthermore, the result about two third fins F3a and F3b included in the finFET 100 is indicated by a thin solid line f3.

As shown in FIG. 27, in the first fin F1 (solid line f1), the maximum value of the transconductance gm is larger and the gate voltage Vg corresponding to this maximum value is also higher compared with the second fins F2a and F2b (solid line f2). In the second fins F2a and F2b (solid line f2), the maximum value of the transconductance (gm) is larger and the gate voltage Vg corresponding to this maximum value is also higher compared with the third fins F3a and F3b (solid line f3).

That is, as the gate length of the fin F is decreased, the transconductance gm becomes higher and the gate voltage Vg yielding the rise of the transconductance gm decreases.

The transconductance gm of the finFET 100 having the respective fins F1, F2a, F2b, F3a, and F3b is equivalent to the synthesis of the results (f1, f2, f3) of these fins F1, F2a, F2b, F3a, and F3b as shown by the heavy solid line fa in FIG. 27.

Thus, the finFET 100 of the present embodiment has a lower degree of the decrease of the transconductance gm from its peak compared with a finFET composed of any of the first fin F1, the second fins F2a and F2b, and the third fins F3a and F3b, similarly to the first embodiment. That is, the curve indicating the voltage dependence of the transconductance gm is flatter. Thus, the present embodiment can achieve widening of the band of the gain in a high-frequency RFIC similarly to the first embodiment. Furthermore, the present embodiment can achieve reduction in the distortion of the element characteristics.

Moreover, five fins F1, F2a, F2b, F3a, and F3b are so arranged that the gate lengths thereof are symmetric with each other in the x direction in the present embodiment.

Thus, the finFET 100 of the present embodiment has no bias in the distribution of the electric field strength, the current distribution, and the heat distribution at the time of the operation, and therefore is allowed to have enhanced reliability and suppressed characteristic variation, similarly to the first embodiment.

In the present embodiment, ion implantation is performed for the channel forming regions of the respective fins F1, F2a, F2b, F3a, and F3b similarly to the first embodiment. However, the present invention is not limited thereto. For example, a non-doped structure obtained without the ion implantation into the channel forming regions of the respective fins F1, F2a, F2b, F3a, and F3b may be employed. This can achieve higher-speed operation.

The present invention is not limited to the above-described embodiments but various modification forms can be employed.

For example, in the above-described embodiments, the finFET 100 includes the fins F1, F2a, F2b, F3a, and F3b having three kinds of threshold voltages Vth. However, the present invention is not limited thereto. The same advantages can be achieved also when the finFET includes fins having two kinds of threshold voltages Vth. Furthermore, the same advantages can be achieved also when the finFET includes fins having four or more kinds of threshold voltages Vth.

Although the sidewalls SW are provided in the above-described embodiments, the present invention is not limited thereto. Favorable effects can be achieved also when the sidewalls SW are absent.

The embodiments of the present invention provide a fin field effect transistor having small voltage dependence of the transconductance gm and thus can be applied to various devices depending on the use purpose.

Combining the above-described embodiments with each other can also achieve the same advantages. For example, plural fins may both have plural kinds of fin widths as with the first embodiment and have plural kinds of impurity concentrations of the channel forming region in the fin as with the second embodiment. In addition, the plural fins may also have plural kinds of gate lengths of the fin as with the third embodiment.

In the above-described embodiments, the substrate 1 is equivalent to the substrate of the present invention. In the above-described embodiments, the finFET 100 is equivalent to the fin field effect transistor of the present invention. In the above-described embodiments, the first fin F1 is equivalent to the first fin of the present invention. In the above-described embodiments, the second fins F2a and F2b are equivalent to the second fin of the present invention. In the above-described embodiments, the third fins F3a and F3b are equivalent to the second fin of the present invention.

The present application contains subject matter related to that disclosed in Japanese Priority Patent Application JP 2008-107072 filed in the Japan Patent Office on Apr. 16, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising
a fin field effect transistor configured to include at least a first fin and a second fin, the first fin having a first drain region, the second fin having a second drain region connected to the first drain region; and
a gate electrode provided in common for the first fin and the second fin, wherein
threshold voltage of the first fin and threshold voltage of the second fin are different from each other in the fin field effect transistor.

2. The semiconductor device according to claim 1, wherein the first fin and the second fin each extend along a first direction of a substrate plane and are different from each other in width defined in a second direction perpendicular to the first direction.

3. The semiconductor device according to claim 1, wherein the first fin and the second fin are different from each other in a doping amount of an impurity element in a channel forming region.

4. The semiconductor device according to claim 1, wherein gate length of the first fin and gate length of the second fin are different from each other.

5. The semiconductor device according to claim 1, wherein the second fin is provided in plurality, and the first fin and the second fins each extend along a first direction of a substrate plane and are arranged at intervals along a second direction perpendicular to the first direction, and the first fin and the second fins are arranged symmetrically in the second direction.

6. The semiconductor device according to claim 2, wherein the first fin and the second fin are different from each other in a doping amount of an impurity element in a channel forming region.

7. The semiconductor device according to claim 2, wherein gate length of the first fin and gate length of the second fin are different from each other.

8. The semiconductor device according to claim 2, wherein the second fin is provided in plurality, and the first fin and the second fins each extend along a first direction of a substrate plane and are arranged at intervals along a second direction perpendicular to the first direction, and the first fin and the second fins are arranged symmetrically in the second direction.

9. The semiconductor device according to claim 1, wherein the a fin field effect transistor further includes a third fin, wherein the second fin comprises a pair of second fins on either side of the first fin, the third fin comprises a pair of third fins on either side of the second fins.

10. The semiconductor device according to claim 9, wherein the third fin is wider that the second fin, the second fin being wider than the first fin.

11. The semiconductor device according to claim 10, wherein a threshold voltage for the third fin is greater than the threshold voltage for the second fin, the threshold voltage for the second fin being greater than the threshold voltage for the first fin.

12. The semiconductor device according to claim 11, wherein the first fin, the second fin, and the third fins include a source region and drain region formed along a y direction of the semiconductor device, the source region and the drain region sandwich a channel forming region on either side.

13. The semiconductor device according to claim 12, wherein a silicide layer is formed to cover top surfaces of the source region and the drain region of the first fin.

14. A semiconductor device comprising:
a fin field effect transistor configured to include at least a first fin, a second pair of fins on either side of the first fin, and a third pair of fins on either side of the second pair of fins, a width of the third pair of fins being greater than a width of the second pair of fins, and the width of the second pair of fins being greater than a width of the first fin; and
a gate electrode provided in common for the first fin, the second pair of fins, and the third pair of fins, wherein
a first threshold voltage of the first fin, a second threshold voltage of the second pair of fins, and a third threshold voltage of the third pair of fins are different from each other in the fin field effect transistor.

15. The semiconductor device according to claim 14, wherein the first fin, the second pair of fins, and the third pair of fins include a source region and drain region formed along a y direction of the semiconductor device, the source region and drain region sandwich a channel forming region on either side.

16. The semiconductor device according to claim 15, wherein a silicide layer is formed to cover top surfaces of the source regions and the drain regions.

17. The semiconductor device according to claim 14, wherein a buried oxide film is formed on a substrate of the fin field effect transistor, the gate electrode intersects with the first fin, the second pair of fins, and the third pair of fins at right angles.

18. The semiconductor device according to claim 14, wherein the first fin, the second pair of fins, and the third pair of fins are separated by intervals, the width of the third pair of fins is wider than the second pair of fins by at least 70 nm, and wherein the width of the second pair of fins is wider than the first fin by at least 70 nm.

19. The semiconductor device according to claim 14, wherein a length of the first fin, the second pair of fins, and the third pair of fins is identical.

* * * * *